(12) United States Patent
Hayashi et al.

(10) Patent No.: US 11,052,432 B2
(45) Date of Patent: Jul. 6, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventors: Masayuki Hayashi, Kyoto (JP); Nobuyuki Shibayama, Kyoto (JP); Toru Endo, Kyoto (JP)

(73) Assignee: SCREEN Holdings Co., Ltd.

( * ) Notice: Subject to any disclaimer, the term of this patent is extended or adjusted under 35 U.S.C. 154(b) by 287 days.

(21) Appl. No.: 16/361,309

(22) Filed: Mar. 22, 2019

(65) Prior Publication Data

US 2019/0308224 A1 Oct. 10, 2019

(30) Foreign Application Priority Data

Mar. 26, 2018 (JP) .............................. JP2018-057501
Nov. 1, 2018 (JP) .............................. JP2018-206627

(51) Int. Cl.
*B08B 3/08* (2006.01)
*B01F 3/08* (2006.01)
*H01L 21/67* (2006.01)

(52) U.S. Cl.
CPC .............. *B08B 3/08* (2013.01); *B01F 3/088* (2013.01); *H01L 21/67034* (2013.01); *H01L 21/67057* (2013.01)

(58) Field of Classification Search
CPC ...................................................... B08B 3/08
See application file for complete search history.

(56) References Cited

U.S. PATENT DOCUMENTS

| 2002/0108643 | A1 | 8/2002 | Yasuda et al. |
| 2010/0175714 | A1 | 7/2010 | Nagai et al. |
| 2014/0216500 | A1 | 8/2014 | Hsiao et al. ................ 134/10 |
| 2014/0373882 | A1 | 12/2014 | Yoshida |
| 2015/0114432 | A1 | 4/2015 | Iwata et al. |
| 2018/0029089 | A1 | 2/2018 | Miura et al. |

FOREIGN PATENT DOCUMENTS

| JP | 2002-068715 A | 3/2002 |
| JP | 2008-066464 A | 3/2008 |
| JP | 2008-235341 A | 10/2008 |
| JP | 2009-218405 A | 9/2009 |
| JP | 2012-049391 A | 3/2012 |
| JP | 2012-195524 A | 10/2012 |
| JP | 2013-207080 A | 10/2013 |
| JP | 2015-082650 A | 4/2015 |
| JP | 2018-018899 A | 2/2018 |
| JP | 2018-019016 A | 2/2018 |

*Primary Examiner* — Jason Y Ko
(74) *Attorney, Agent, or Firm* — Ostrolenk Faber LLP

(57) ABSTRACT

A first SPM, prepared by mixing sulfuric acid and hydrogen peroxide water at a first mixing ratio, is supplied to a substrate. A second SPM, prepared by mixing the sulfuric acid and the hydrogen peroxide water at a second mixing ratio greater than the first mixing ratio, is supplied to the substrate after the supply of the first SPM is stopped. The first SPM expelled from the substrate flows into a drain piping. The second SPM expelled from the substrate flows into a recovery piping. SPM is prepared by mixing the hydrogen peroxide water with sulfuric acid contained in the second SPM guided by the recovery piping.

30 Claims, 9 Drawing Sheets

SUBSTRATE PROCESSING METHOD AND SUBSTRATE PROCESSING APPARATUS

CROSS REFERENCE TO RELATED APPLICATIONS

This application claims the benefit of priority to Japanese Patent Application No. 2018-057501 filed on Mar. 26, 2018 and Japanese Patent Application No. 2018-206627 filed on Nov. 1, 2018. The entire contents of these applications are hereby incorporated herein by reference.

BACKGROUND OF THE INVENTION

1. Field of the Invention

The present invention relates to a substrate processing method and a substrate processing apparatus that process a substrate. Examples of substrates to be processed include a semiconductor wafer, a substrate for a flat panel display (FPD) such as a liquid crystal display and an organic electroluminescence (organic EL) display, a substrate for an optical disc, a substrate for a magnetic disk, a substrate for a magneto-optical disc, a substrate for a photomask, a ceramic substrate, a substrate for a solar cell, and the like.

2. Description of the Related Art

In the manufacturing process of a semiconductor device and a liquid crystal display, etc., a substrate processing apparatus is used which processes a substrate such as a semiconductor wafer or a glass substrate for a liquid crystal display.

JP 2018-019016 A discloses a single substrate processing type substrate processing apparatus that processes substrate one by one. The substrate processing apparatus includes a spin chuck, rotating a substrate while holding it horizontally, and a nozzle, discharging SPM (a liquid mixture of sulfuric acid and hydrogen peroxide water) toward the substrate held by the spin chuck. In paragraphs 0061 and 0065 of JP 2018-019016 A, it is disclosed that the SPM is supplied to remove a resist film and the SPM supplied to the substrate is recovered.

SUMMARY OF THE INVENTION

Although JP 2018-019016 A discloses that the SPM supplied to the substrate is recovered, no disclosure is made concerning concentrations of the sulfuric acid and the hydrogen peroxide water. By increasing the hydrogen peroxide water concentration, that is, a proportion of a volume of the hydrogen peroxide water before mixing with respect to a volume of the sulfuric acid and the hydrogen peroxide water before mixing is increased, the SPM is increased in removal ability (ability of the SPM to remove the resist).

On the other hand, when the hydrogen peroxide water concentration is increased, the concentration of the sulfuric acid contained in the recovered SPM decreases. In this case, when the recovery and reuse of the SPM are repeated, the concentration of the sulfuric acid contained in the recovered SPM falls, in a short period, to a value not suited for reuse. If the hydrogen peroxide water concentration is decreased to increase the concentration of the sulfuric acid contained in the recovered SPM, the removal ability of the SPM before recovery decreases. Therefore, with the invention described in JP 2018-019016 A, it is not possible to recover SPM with a high concentration of the sulfuric acid while removing the resist efficiently from the substrate.

Thus, an object of the present invention is to provide a substrate processing method and a substrate processing apparatus that enable SPM with a high concentration of sulfuric acid to be recovered while removing resist efficiently from a substrate.

A preferred embodiment of the present invention provides a substrate processing method of removing a resist from a substrate by SPM, which is a liquid mixture of sulfuric acid and hydrogen peroxide water, and the substrate processing method includes a first SPM supplying step of supplying the substrate with a first SPM prepared by mixing the sulfuric acid and the hydrogen peroxide water at a first mixing ratio that represents a ratio of the sulfuric acid with respect to the hydrogen peroxide water, a sulfuric-acid-containing liquid supplying step of supplying the substrate with a sulfuric-acid-containing liquid containing the sulfuric acid at a higher concentration than that of the first SPM, after the supply of the first SPM in the first SPM supplying step is stopped, a draining step of making the first SPM, supplied to the substrate and expelled from the substrate in the first SPM supplying step, flow into a drain piping, a recovery step of making the sulfuric-acid-containing liquid, supplied to the substrate and expelled from the substrate in the sulfuric-acid-containing liquid supplying step, flow into a recovery piping, and a remixing step of preparing the SPM by mixing the hydrogen peroxide water with the sulfuric-acid-containing liquid guided by the recovery piping.

The first SPM, supplied to the substrate and expelled from the substrate, flows not into the recovery piping but into the drain piping. The first SPM expelled from the substrate is relatively high in hydrogen peroxide water concentration and relatively low in sulfuric acid concentration. Not only that, the first SPM expelled from the substrate contains a large amount of contaminants (carbide of the resist, etc.) formed by reaction of the first SPM and the resist. The first SPM expelled from the substrate is thus not suited for recovery.

On the other hand, the sulfuric-acid-containing liquid expelled from the substrate is relatively high in sulfuric acid concentration. Further, an amount of contaminants contained in the sulfuric-acid-containing liquid expelled from the substrate is less than the amount of contaminants contained in the first SPM expelled from the substrate. The sulfuric-acid-containing liquid that is relatively high in sulfuric acid concentration and low in contaminant content is thus guided to the recovery piping and mixed again with the hydrogen peroxide water. Thereby, the sulfuric acid contained in the sulfuric-acid-containing liquid reacts with the hydrogen peroxide water and fresh SPM is prepared. A disposal amount of the SPM can thus be reduced.

The sulfuric-acid-containing liquid that is high in sulfuric acid concentration can thus be recovered. Further, the state where the concentration of the sulfuric-acid is high is not maintained but the first SPM that is high in hydrogen peroxide water concentration and has sufficient removal ability is supplied to the substrate before starting the recovery of the liquid that removes the resist. The resist can thereby be removed efficiently from the substrate. The sulfuric-acid-containing liquid that is high in sulfuric acid concentration can thus be recovered while removing the resist efficiently from the substrate.

In the preferred embodiment, at least one of the following features may be added to the substrate processing method.

The sulfuric-acid-containing liquid supplying step includes a second SPM supplying step of supplying the substrate with a second SPM prepared by mixing the sulfuric acid and the hydrogen peroxide water at a second mixing ratio that represents a ratio of the sulfuric acid with respect to the hydrogen peroxide water and is greater than the first mixing ratio, after the supply of the first SPM in the first SPM supplying step is stopped, the recovery step includes a step of making the second SPM, supplied to the substrate and expelled from the substrate in the second SPM supplying step, flow into the recovery piping, and the remixing step includes a step of preparing the SPM by mixing the hydrogen peroxide water with sulfuric acid that contains the second SPM guided by the recovery piping.

According to this arrangement, the sulfuric acid and the hydrogen peroxide water are mixed to prepare the first SPM and the prepared first SPM is supplied to the substrate. Then, after the supply of the first SPM is stopped, the sulfuric acid and the hydrogen peroxide water are mixed to prepare the second SPM and the prepared second SPM is supplied to the substrate. The first SPM and the second SPM are thereby supplied to the substrate and the resist is removed from the substrate.

In preparing the first SPM, the sulfuric acid and the hydrogen peroxide water are mixed at the first mixing ratio. In preparing the second SPM, the sulfuric acid and the hydrogen peroxide water are mixed at the second mixing ratio. Each of the first mixing ratio and the second mixing ratio represents a ratio of volume of the sulfuric acid before mixing with respect to volume of the hydrogen peroxide water before mixing. The first mixing ratio is less than the second mixing ratio. The concentration of the hydrogen peroxide water contained in the first SPM is thus higher than the concentration of the hydrogen peroxide water contained in the second SPM.

Due to being relatively high in the hydrogen peroxide water concentration, the first SPM has a higher removal ability than the second SPM. The resist can thus be removed from the substrate efficiently. Also, the second SPM is supplied to the substrate after the first SPM is supplied to the substrate. Although the second SPM is inferior to the first SPM in removal ability, nearly all of the resist is removed from the substrate by the supply of the first SPM and just resist that is comparatively easy to remove remains on the substrate. The resist can thus be removed from the substrate reliably even with the second SPM of inferior removal ability.

The first SPM, supplied to the substrate and expelled from the substrate, flows not into recovery piping but into the drain piping. The first SPM expelled from the substrate is relatively high in hydrogen peroxide water concentration and relatively low in sulfuric acid concentration. Not only that, the first SPM expelled from the substrate contains a large amount of contaminants (carbide of the resist, etc.) formed by the reaction of the first SPM and the resist. The first SPM expelled from the substrate is thus not suited for recovery.

On the other hand, the second SPM expelled from the substrate is relatively high in sulfuric acid concentration. Further, an amount of contaminants contained in the second SPM expelled from the substrate is less than the amount of contaminants contained in the first SPM expelled from the substrate. The second SPM that is relatively high in sulfuric acid concentration and low in contaminant content is thus guided to the recovery piping and mixed again with the hydrogen peroxide water. Thereby, the sulfuric acid contained in the second SPM reacts with the hydrogen peroxide water and fresh SPM is prepared. The disposal amount of the SPM can thus be reduced.

The SPM is thus recovered when the sulfuric acid concentration, that is, a proportion of the volume of the sulfuric acid before mixing with respect to the volume of the sulfuric acid and the hydrogen peroxide water before mixing is high, and SPM of high sulfuric acid concentration can thus be recovered. Further, the state where the concentration of the sulfuric-acid is high is not maintained but the SPM that is high in hydrogen peroxide water concentration and has sufficient removal ability is supplied to the substrate before starting the recovery of the SPM, and therefore the resist can be removed efficiently from the substrate. The SPM that is high in sulfuric acid concentration can thus be recovered while removing the resist efficiently from the substrate.

The supply of the first SPM means that the first SPM or the sulfuric acid and the hydrogen peroxide water before mixing is or are discharged toward the substrate. The same applies to the second SPM and to a third SPM, described below. That is, the sulfuric acid and the hydrogen peroxide water may be mixed before being discharged toward the substrate from a nozzle or may be mixed after being discharged from a plurality of nozzles. In the latter case, the sulfuric acid and the hydrogen peroxide water may be mixed in a space between the plurality of nozzles and the substrate or may be mixed on the substrate.

The substrate processing method further includes a first SPM capturing step of making a first guard, surrounding the substrate and connected to the drain piping, receive the first SPM expelled from the substrate in the first SPM supplying step and a second SPM capturing step of making a second guard, surrounding the substrate and connected to the recovery piping, receive the second SPM expelled from the substrate in the second SPM supplying step.

According to this arrangement, the first SPM expelled from the substrate is received by the first guard surrounding the substrate. The second SPM expelled from the substrate is received by the second guard surrounding the substrate. The first SPM received by the first guard flows into the drain piping connected to the first guard. The second SPM received by the second guard flows into the recovery piping connected to the second guard.

The first SPM expelled from the substrate contains a large amount of contaminants. Therefore, after the first guard receives the first SPM, contaminants may remain on an inner wall of the first guard. If the second SPM expelled from the substrate is received and recovered by the first guard, the contaminants attached to the first guard may become mixed in the second SPM. An amount of contaminants contained in the recovered SPM can thus be reduced by making the second SPM be received by the second guard that differs from the first guard.

The substrate processing method further includes a guard switching step of switching a state of the first guard and the second guard from a first state, in which liquid expelled from the substrate is received by the first guard, to a second state, in which liquid expelled from the substrate is received by the second guard, at the same time as stopping of or after the stopping of the supply of the first SPM in the first SPM supplying step.

According to this arrangement, the first SPM expelled from the substrate when the supply of the first SPM is stopped is received by the first guard. Thereafter, the state of the first guard and the second guard is switched from the first state to the second state and the second SPM expelled from the substrate is received by the second guard. That is, the switching from the state, in which the first guard faces the substrate directly, to the state, in which the second guard faces the substrate directly, is performed after the expelling of the first SPM of high contaminant content ends. Contamination of the second guard by the first SPM of high contaminant content can thereby be prevented.

The guard switching step includes a step of switching the state of the first guard and the second guard from the first state to the second state after the supply of the second SPM is started in the second SPM supplying step.

According to this arrangement, the first SPM expelled from the substrate is received by the first guard. Thereafter, the second SPM is supplied to the substrate and expelled from the substrate. The second SPM expelled from the substrate when the supply of the second SPM is started is received by the first guard. Thereafter, the state of the first guard and the second guard is switched from the first state to the second state and the second SPM expelled from the substrate is received by the second guard.

The amount of contaminants contained in the second SPM expelled from the substrate is less than the amount of contaminants contained in the first SPM expelled from the substrate. Therefore, the first SPM of high contaminant content is received by the first guard and thereafter, the second SPM of low contaminant content is received by the first guard. The contaminants attached to the inner wall of the first guard are thereby washed off. When the contaminants attached to the first guard are dried, the contaminants may drift in a space in which the substrate is disposed and become attached to the substrate. Contamination of the substrate can thus be reduced.

Further, when the supply of the second SPM is started, the resist that is comparatively easy to remove remains on the substrate and contaminants may be contained in the second SPM expelled from the substrate. In this case, after elapse of some time from the start of supply of the second SPM, all of the resist is removed from the substrate and the second SPM that does not contain or hardly contains contaminants is expelled from the substrate.

Even if contaminants are contained in the second SPM expelled from the substrate when the supply of the second SPM is started, such second SPM is guided to the drain piping via the first guard. The second SPM that contains contaminants can thus be prevented from being recovered in the recovery piping. Further, the first guard is cleaned using such second SPM and therefore the first guard can be cleaned without increasing a usage amount of the SPM.

The guard switching step includes a relative moving step of moving the substrate and the first guard relatively in an up-down direction while making the first guard receive the second SPM expelled from the substrate.

According to this arrangement, the substrate and the first guard are moved relatively in the up-down direction when the second SPM expelled from the substrate is received by the first guard. A position at which the second SPM directly hits the inner wall of the first guard is thereby moved up or down with respect to the first guard. A range in which the second SPM directly hits the first guard is thus broadened and the contaminants attached to the inner wall of the first guard can thus be removed effectively.

The relative moving step may be a step of moving just the substrate or just the first guard in the up-down direction or may be a step of moving both the substrate and the first guard in the up-down direction. The relative moving step may be a step of moving just the first guard in just the down direction until the state of the first guard and the second guard is switched to the second state. Also, the relative moving step may include a step of temporarily stopping the first guard before the state of the first guard and the second guard is switched to the second state.

The first SPM supplying step includes an in-nozzle mixing step of mixing the sulfuric acid and the hydrogen peroxide water inside the nozzle and discharging the first SPM, prepared inside the nozzle, from the nozzle toward the substrate.

According to this arrangement, the sulfuric acid and the hydrogen peroxide water are supplied to the nozzle and are mixed inside the nozzle. The first SPM is thereby prepared.

Thereafter, the first SPM is supplied to the substrate. An oxidizing ability of peroxymonosulfuric acid (also called "Caro's acid"), which is formed by the reaction of the sulfuric acid and the hydrogen peroxide water, decreases with the elapse of time. Such decrease in oxidizing ability can be kept at a minimum by supplying the SPM, which is the liquid mixture of the sulfuric acid and the hydrogen peroxide water, immediately after mixing the sulfuric acid and the hydrogen peroxide water. The first SPM of high removal ability can thereby be supplied to the substrate and time required for removing the resist can be shortened.

The substrate processing method further includes a mixing ratio continuously increasing step of continuously increasing the ratio of the sulfuric acid with respect to the hydrogen peroxide water from the first mixing ratio to the second mixing ratio while supplying the SPM to the substrate in the first SPM supplying step and the second SPM supplying step.

According to this arrangement, the mixing ratio (ratio of the sulfuric acid with respect to the hydrogen peroxide water) is continuously increased from the first mixing ratio to the second mixing ratio when the SPM is being supplied to the substrate. Thereby, the first SPM is supplied to the substrate and the second SPM is supplied to the substrate thereafter. When the hydrogen peroxide water contained in the SPM decreases and the hydrogen peroxide water concentration decreases, the SPM decreases in temperature. The temperature of the SPM can be made to change continuously by changing the mixing ratio continuously. The resist can thus be removed efficiently while preventing sudden temperature change of the substrate.

The recovery step includes a step of making the second SPM, supplied to the substrate and expelled from the substrate in the second SPM supplying step, flow into the recovery piping, and a step of making the second SPM that flowed into the recovery piping flow into a sulfuric acid tank storing the sulfuric acid, and the substrate processing method further includes a sulfuric acid concentration measuring step of measuring the sulfuric acid concentration of the sulfuric acid inside the sulfuric acid tank and a sulfuric acid replenishing step of supplying sulfuric acid, having a sulfuric acid concentration higher than that of the sulfuric acid inside the sulfuric acid tank, into the sulfuric acid tank when the sulfuric acid concentration measured in the sulfuric acid concentration measuring step falls below a lower limit value.

Although the recovered second SPM contains components besides the sulfuric acid, not less than half of it is the sulfuric acid. When the recovery and reuse of the SPM are repeated, the sulfuric acid concentration of the recovered sulfuric acid decreases gradually. In other words, the sulfuric acid contained in the recovered SPM gradually increases in water concentration. The second SPM that flowed into the recovery piping is recovered in the sulfuric acid tank that stores the sulfuric acid. When the sulfuric acid concentration of the sulfuric acid inside the sulfuric acid tank is measured and the measured sulfuric acid concentration falls below the lower limit value, the sulfuric acid of higher sulfuric acid concentration than the sulfuric acid inside the sulfuric acid tank is supplied into the sulfuric acid tank. The sulfuric acid concentration of the sulfuric acid inside the sulfuric acid tank can thereby be maintained within a range suitable for reuse.

A time over which the first SPM is supplied to the substrate in the first SPM supplying step is longer than a time over which the second SPM is supplied to the substrate in the second SPM supplying step.

According to this arrangement, the first SPM is supplied to the substrate for a long time. That is, the time over which the first SPM is supplied to the substrate is longer than the time over which the second SPM is supplied to the substrate. The SPM of high removal ability is thus supplied to the substrate for a long time. Time required for removal of the resist can thus be shortened in comparison to a case where the second SPM is supplied to the substrate for a long time.

The time over which the first SPM is supplied to the substrate in the first SPM supplying step is shorter than the time over which the second SPM is supplied to the substrate in the second SPM supplying step.

According to this arrangement, the second SPM is supplied to the substrate for a long time. That is, the time over which the first SPM is supplied to the substrate is shorter than the time over which the second SPM is supplied to the substrate. A time over which the SPM is recovered can thus be elongated in comparison to a case where the first SPM is supplied to the substrate for a long time. An amount of the SPM that is to be reused can thereby be increased and the disposal amount of the SPM can be decreased.

The substrate processing method further includes a third SPM supplying step of supplying the substrate with a third SPM prepared by mixing the sulfuric acid and the hydrogen peroxide water at a third mixing ratio that represents a ratio of the sulfuric acid with respect to the hydrogen peroxide water and is greater than the first mixing ratio, before the supply of the first SPM to the substrate is started in the first SPM supplying step.

According to this arrangement, the third SPM of high sulfuric acid concentration is supplied to the substrate before supplying the first SPM of high hydrogen peroxide water concentration to the substrate. In a case where a pattern of low strength is formed on the substrate, when the removal of the resist is started by supplying the SPM of high hydrogen peroxide water concentration to the substrate, the pattern may sustain damage. Pattern damage can thus be reduced, even in the case where a pattern of low strength is formed on the substrate, by increasing the hydrogen peroxide water concentration stepwise or continuously.

The substrate processing method may further include a mixing ratio continuously decreasing step of continuously decreasing the ratio of the sulfuric acid with respect to the hydrogen peroxide water from the third mixing ratio to the first mixing ratio while supplying the SPM to the substrate in the first SPM supplying step and the third SPM supplying step. In this case, pattern damage can be reduced in comparison to a case of reducing the ratio of the sulfuric acid with respect to the hydrogen peroxide water stepwise. The third mixing ratio maybe equal to or different from the second mixing ratio.

A flow rate (amount discharged per unit time; same applies hereinafter) of the second SPM discharged toward the substrate in the second SPM supplying step is greater than a flow rate of the first SPM discharged toward the substrate in the first SPM supplying step. If the flow rate of at least one of the first and second SPMs changes with the elapse of time, a maximum value of the flow rate of the second SPM may be greater than a maximum value of the flow rate of the first SPM. A total amount of the second SPM supplied to the substrate is preferably greater than a total amount of the first SPM supplied to the substrate.

According to this arrangement, after the supply of the first SPM is stopped, the ratio of the sulfuric acid with respect to the hydrogen peroxide water is increased to the second mixing ratio and the second SPM is discharged toward the substrate at the flow rate greater than the flow rate of the first SPM. Although a heat of reaction decreases due to decrease in the hydrogen peroxide water concentration, a temperature of the SPM on the substrate can be increased because the flow rate of the SPM discharged toward the substrate is increased. Decrease in peeling ability that accompanies the decrease in the hydrogen peroxide water concentration can thereby be compensated.

The substrate processing method further includes a fourth SPM supplying step of supplying the substrate with a fourth SPM prepared by mixing the sulfuric acid and the hydrogen peroxide water at a fourth mixing ratio that represents a ratio of the sulfuric acid with respect to the hydrogen peroxide water and is greater than the second mixing ratio, after the second SPM supplying step, the recovery step includes a step of making the second SPM, supplied to the substrate and expelled from the substrate in the second SPM supplying step, flow into the recovery piping and a step of making the fourth SPM, supplied to the substrate and expelled from the substrate in the fourth SPM supplying step, flow into the recovery piping, and the remixing step includes a step of preparing the SPM by mixing the hydrogen peroxide water with sulfuric acid that contains the second SPM and the fourth SPM guided by the recovery piping.

According to this arrangement, the fourth SPM of higher sulfuric acid concentration than the second SPM is supplied to the substrate after the second SPM is supplied to the substrate. As with the second SPM, the fourth SPM flows into the recovery piping and used to prepare fresh SPM. The concentration of the sulfuric acid contained in the recovered SPM can thus be increased stepwise or continuously. The SPM of high sulfuric acid concentration can thereby be recovered.

The first SPM supplying step includes a step of preparing the first SPM by mixing sulfuric acid, having a sulfuric acid concentration higher than that of the sulfuric acid used in preparing the second SPM, with the hydrogen peroxide water at the first mixing ratio and the second SPM supplying step includes a step of preparing the second SPM by mixing the sulfuric acid, which contains the second SPM that flowed into the recovery piping, with the hydrogen peroxide water at the second mixing ratio.

As the recovery of the second SPM is continued, the sulfuric acid concentration of the sulfuric acid inside the sulfuric acid tank, to which the recovered second SPM is supplied, decreases gradually, and in some cases, the peeling ability of the SPM, prepared using the sulfuric acid inside the sulfuric acid tank, falls. By preparing the SPM using sulfuric acid of high concentration, that is, sulfuric acid inside a high concentration sulfuric acid tank, the SPM of high peeling ability can be made to contact a front surface of the resist. Therefore, even if a hardened layer is formed on the surface of the resist, the hardened layer of the resist can be destroyed. After the hardened layer is destroyed, the SPM permeates into an interior of the resist (unhardened resist) through cracks in the hardened layer and the resist can thus be peeled even if the SPM, prepared using the sulfuric acid that contains the recovered SPM, is supplied to the substrate. The resist on the substrate can thereby be peeled reliably in a short time while suppressing a usage amount of high concentration sulfuric acid.

Another preferred embodiment of the present invention provides a substrate processing apparatus that removes a resist from a substrate by SPM, which is a liquid mixture of sulfuric acid and hydrogen peroxide water, and the substrate processing apparatus includes a substrate holding unit that holds the substrate at least a portion of which is covered by the resist, a sulfuric-acid-containing liquid supplying unit, including a mixing ratio changing unit that changes a ratio of the sulfuric acid with respect to the hydrogen peroxide water, preparing the SPM by mixing the sulfuric acid and the hydrogen peroxide water, and supplying a sulfuric-acid-containing liquid, containing the sulfuring acid, to the substrate held by the substrate holding unit, a drain piping, into which flows a liquid that is supplied to the substrate held by the substrate holding unit and expelled from the substrate, a recovery piping, into which flows a liquid that is supplied to the substrate held by the substrate holding unit and expelled from the substrate, a switching unit, switching a piping, into which flows a liquid that is expelled from the substrate held by the substrate holding unit, between the drain piping and the recovery piping, and a controller, controlling the sulfuric-acid-containing liquid supplying unit and the switching unit.

The controller executes a first SPM supplying step of controlling the sulfuric-acid-containing liquid supplying unit to prepare a first SPM by mixing the sulfuric acid and the hydrogen peroxide water at a first mixing ratio that represents a ratio of the sulfuric acid with respect to the hydrogen peroxide water, and supply the prepared first SPM to the substrate held by the substrate holding unit, a sulfuric-acid-containing liquid supplying step of controlling the sulfuric-acid-containing liquid supplying unit to prepare the sulfuric-acid-containing liquid of higher sulfuric acid concentration than that of the first SPM and supply the prepared sulfuric-acid-containing liquid to the substrate held by the substrate holding unit after the supply of the first SPM in the first SPM supplying step is stopped, a draining step of controlling the switching unit to make the first SPM, supplied to the substrate and expelled from the substrate in the first SPM supplying step, flow into the drain piping, a recovery step of controlling the switching unit to make the sulfuric-acid-containing liquid, supplied to the substrate and expelled from the substrate in the sulfuric-acid-containing liquid supplying step, flow into the recovery piping, and a remixing step of controlling the sulfuric-acid-containing liquid supplying unit to prepare the SPM by mixing the hydrogen peroxide water with sulfuric acid that contains the sulfuric-acid-containing liquid guided by the recovery piping. According to this arrangement, the same effects as the effects described above can be obtained.

In the preferred embodiment, at least one of the following features may be added to the substrate processing apparatus.

The sulfuric-acid-containing liquid supplying unit includes an SPM supplying unit that mixes the sulfuric acid and the hydrogen peroxide water to prepare the SPM, supplies the prepared SPM to the substrate held by the substrate holding unit, and is provided with the mixing ratio changing unit.

The sulfuric-acid-containing liquid supplying step includes a second SPM supplying step of preparing a second SPM by mixing the sulfuric acid and the hydrogen peroxide water at a second mixing ratio that represents a ratio of the sulfuric acid with respect to the hydrogen peroxide water and is greater than the first mixing ratio, and supplying the prepared second SPM to the substrate, held by the substrate holding unit, after the supply of the first SPM in the first SPM supplying step is stopped, the recovery step includes a step of making the second SPM, supplied to the substrate and expelled from the substrate in the second SPM supplying step, flow into the recovery piping, and the remixing step includes a step of preparing the SPM by mixing the hydrogen peroxide water with sulfuric acid that contains the second SPM guided by the recovery piping. According to this arrangement, the same effects as the effects described above can be obtained.

The substrate processing apparatus further includes a first guard, connected to the drain piping and surrounding the substrate held by the substrate holding unit, and a second guard, connected to the recovery piping and surrounding the substrate held by the substrate holding unit, the switching unit includes a guard switching unit, switching a state of the first guard and the second guard between a first state, in which liquid expelled from the substrate is received by the first guard, and a second state, in which liquid expelled from the substrate is received by the second guard, and the controller further executes a first SPM capturing step of controlling the guard switching unit to make the first guard receive the first SPM expelled from the substrate in the first SPM supplying step and a second SPM capturing step of controlling the guard switching unit to make the second guard receive the second SPM expelled from the substrate in the second SPM supplying step. According to this arrangement, the same effects as the effects described above can be obtained.

The controller further executes a guard switching step of controlling the guard switching unit to switch the state of the first guard and the second guard from the first state to the second state at the same time as stopping of or after the stopping of the supply of the first SPM in the first SPM supplying step. According to this arrangement, the same effects as the effects described above can be obtained.

The guard switching step includes a step of switching the state of the first guard and the second guard from the first state to the second state after the supply of the second SPM is started in the second SPM supplying step. According to this arrangement, the same effects as the effects described above can be obtained.

The guard switching unit includes a guard elevating/lowering unit that elevates and lowers the first guard and the second guard individually and the guard switching step includes a relative moving step of making the guard elevating/lowering unit move the substrate and the first guard move relatively in an up-down direction while making the first guard receive the second SPM expelled from the substrate. According to this arrangement, the same effects as the effects described above can be obtained.

The sulfuric-acid-containing liquid supplying unit includes a nozzle, discharging the SPM toward the substrate held by the substrate holding unit, and the first SPM supplying step includes an in-nozzle mixing step of mixing the sulfuric acid and the hydrogen peroxide water inside the nozzle and discharging the first SPM, prepared inside the nozzle, from the nozzle toward the substrate. According to this arrangement, the same effects as the effects described above can be obtained.

The controller further executes a mixing ratio continuously increasing step of controlling the mixing ratio changing unit to continuously increase the ratio of the sulfuric acid with respect to the hydrogen peroxide water from the first mixing ratio to the second mixing ratio while supplying the SPM to the substrate in the first SPM supplying step and the second SPM supplying step. According to this arrangement, the same effects as the effects described above can be obtained.

The substrate processing apparatus further includes a sulfuric acid tank, which stores the sulfuric acid and into which flows the second SPM that flowed into the recovery piping, a sulfuric acid concentration meter, measuring a sulfuric acid concentration of the sulfuric acid inside the sulfuric acid tank, and a sulfuric acid replenishing unit, supplying sulfuric acid having a sulfuric acid concentration higher than that of the sulfuric acid inside the sulfuric acid tank, into the sulfuric acid tank, the recovery step includes a step of making the second SPM, supplied to the substrate and expelled from the substrate in the second SPM supplying step, flow into the recovery piping, and a step of making the second SPM that flowed into the recovery piping flow into the sulfuric acid tank, and the controller further executes a sulfuric acid concentration measuring step of making the sulfuric acid concentration meter measure the sulfuric acid concentration of the sulfuric acid inside the sulfuric acid tank and a sulfuric acid replenishing step of making the sulfuric acid replenishing unit replenish the sulfuric acid, having a sulfuric acid concentration higher than that of the sulfuric acid inside the sulfuric acid tank, into the sulfuric acid tank when the sulfuric acid concentration measured in the sulfuric acid concentration measuring step falls below a lower limit value. According to this arrangement, the same effects as the effects described above can be obtained.

A time over which the first SPM is supplied to the substrate in the first SPM supplying step is longer than a time over which the second SPM is supplied to the substrate in the second SPM supplying step. According to this arrangement, the same effects as the effects described above can be obtained.

The time over which the first SPM is supplied to the substrate in the first SPM supplying step is shorter than the time over which the second SPM is supplied to the substrate in the second SPM supplying step. According to this arrangement, the same effects as the effects described above can be obtained.

The controller further executes a third SPM supplying step of controlling the SPM supplying unit to prepare a third SPM by mixing the sulfuric acid and the hydrogen peroxide water at a third mixing ratio that represents a ratio of the sulfuric acid with respect to the hydrogen peroxide water and is greater than the first mixing ratio, and supply the prepared third SPM to the substrate, held by the substrate holding unit, before the supply of the first SPM to the substrate is started in the first SPM supplying step. According to this arrangement, the same effects as the effects described above can be obtained.

A flow rate of the second SPM discharged toward the substrate in the second SPM supplying step is greater than a flow rate of the first SPM discharged toward the substrate in the first SPM supplying step. According to this arrangement, the same effects as the effects described above can be obtained.

The controller further executes a fourth SPM supplying step of controlling the SPM supplying unit to prepare a fourth SPM by mixing the sulfuric acid and the hydrogen peroxide water at a fourth mixing ratio that represents a ratio of the sulfuric acid with respect to the hydrogen peroxide water and is greater than the second mixing ratio, and supply the prepared fourth SPM to the substrate, held by the substrate holding unit, after the second SPM supplying step, the recovery step includes a step of making the second SPM, supplied to the substrate and expelled from the substrate in the second SPM supplying step, flow into the recovery piping and a step of making the fourth SPM, supplied to the substrate and expelled from the substrate in the fourth SPM supplying step, flow into the recovery piping, and the remixing step includes a step of preparing the SPM by mixing the hydrogen peroxide water with sulfuric acid that contains the second SPM and the fourth SPM guided by the recovery piping. According to this arrangement, the same effects as the effects described above can be obtained.

The substrate processing apparatus further includes a sulfuric acid tank, which stores the sulfuric acid and into which flows the second SPM that flowed into the recovery piping, and a high concentration sulfuric acid tank, which stores sulfuric acid of higher sulfuric acid concentration than that of the sulfuric acid inside the sulfuric acid tank, the first SPM supplying step includes a step of preparing the first SPM by mixing the sulfuric acid inside the high concentration sulfuric acid tank with the hydrogen peroxide water at the first mixing ratio and the second SPM supplying step includes a step of preparing the second SPM by mixing the sulfuric acid inside the sulfuric acid tank with the hydrogen peroxide water at the second mixing ratio. According to this arrangement, the same effects as the effects described above can be obtained.

The above and other elements, features, steps, characteristics and advantages of the present invention will become more apparent from the following detailed description of the preferred embodiments with reference to the attached drawings.

DETAILED DESCRIPTION OF PREFERRED EMBODIMENTS

Figure 1:
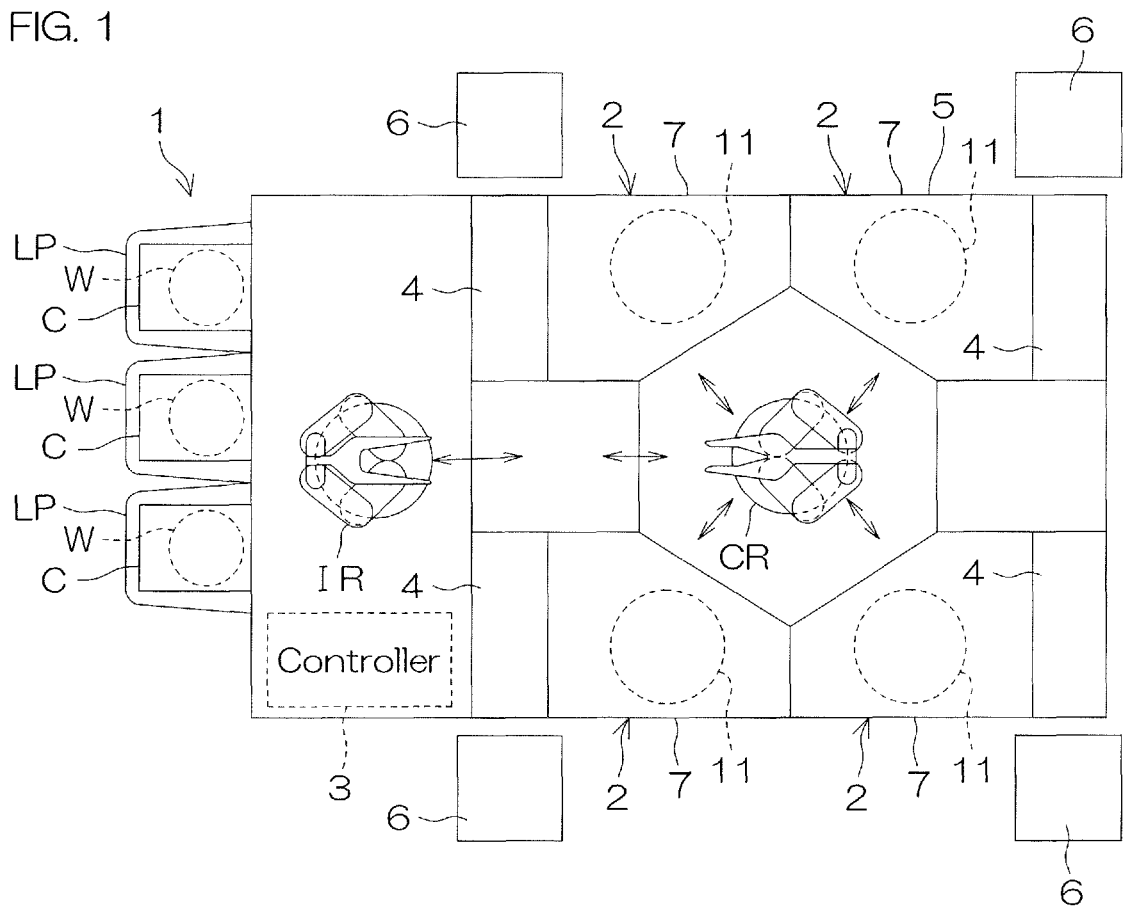
FIG. 1 is an illustrative plan view for describing a layout of an interior of a substrate processing apparatus according to a first preferred embodiment of the present invention.

FIG. 1 is an illustrative plan view for describing a layout of an interior of a substrate processing apparatus 1 according to a first preferred embodiment of the present invention.

The substrate processing apparatus 1 is a single substrate processing type apparatus that processes disk-shaped substrates W, such as semiconductor wafers, etc., one by one. The substrate processing apparatus 1 includes a plurality of load ports LP, holding a plurality of substrate containers C housing substrates W, a plurality (for example, twelve) of processing units 2, processing the substrates W transferred from the plurality of load ports LP with processing liquids, such as a chemical liquid, etc., transfer robots, transferring the substrates W from the plurality of load ports LP to the plurality of processing units 2, and a controller 3, controlling the substrate processing apparatus 1. The transfer robots include an indexer robot IR, transferring the substrates W on a path between the load ports LP and the processing units 2, and a substrate transfer robot CR, transferring the substrates W on a path between the indexer robot IR and the processing units 2.

The substrate processing apparatus 1 includes a plurality of fluid boxes 4, each housing valves, etc., and storage boxes 6, each housing a sulfuric acid tank 27 (see FIG. 2), storing sulfuric acid, etc. The processing units 2 and the fluid boxes 4 are disposed inside a frame 5 of the substrate processing apparatus 1 and are covered by the frame 5 of the substrate processing apparatus 1. Although the storage boxes 6 are disposed outside the frame 5 of the substrate processing apparatus 1 in the example of FIG. 1, these may be housed inside the frame 5 instead. There may be a single storage box 6 corresponding to the plurality of fluid boxes 4 or a plurality of boxes may be provided in one-to-one correspondence to the fluid boxes 4.

The twelve processing units 2 form four towers disposed such as to surround the substrate transfer robot CR in plan view. Each tower includes three processing units 2 that are stacked up and down. The four storage boxes 6 correspond respectively to the four towers. Similarly, the four fluid boxes 4 correspond respectively to the four towers. The sulfuric acid stored in the sulfuric acid tank 27 inside each storage box 6 is supplied to the three processing units 2 corresponding to the storage box 6 via the fluid box 4 corresponding to the storage box 6.

Figure 2:
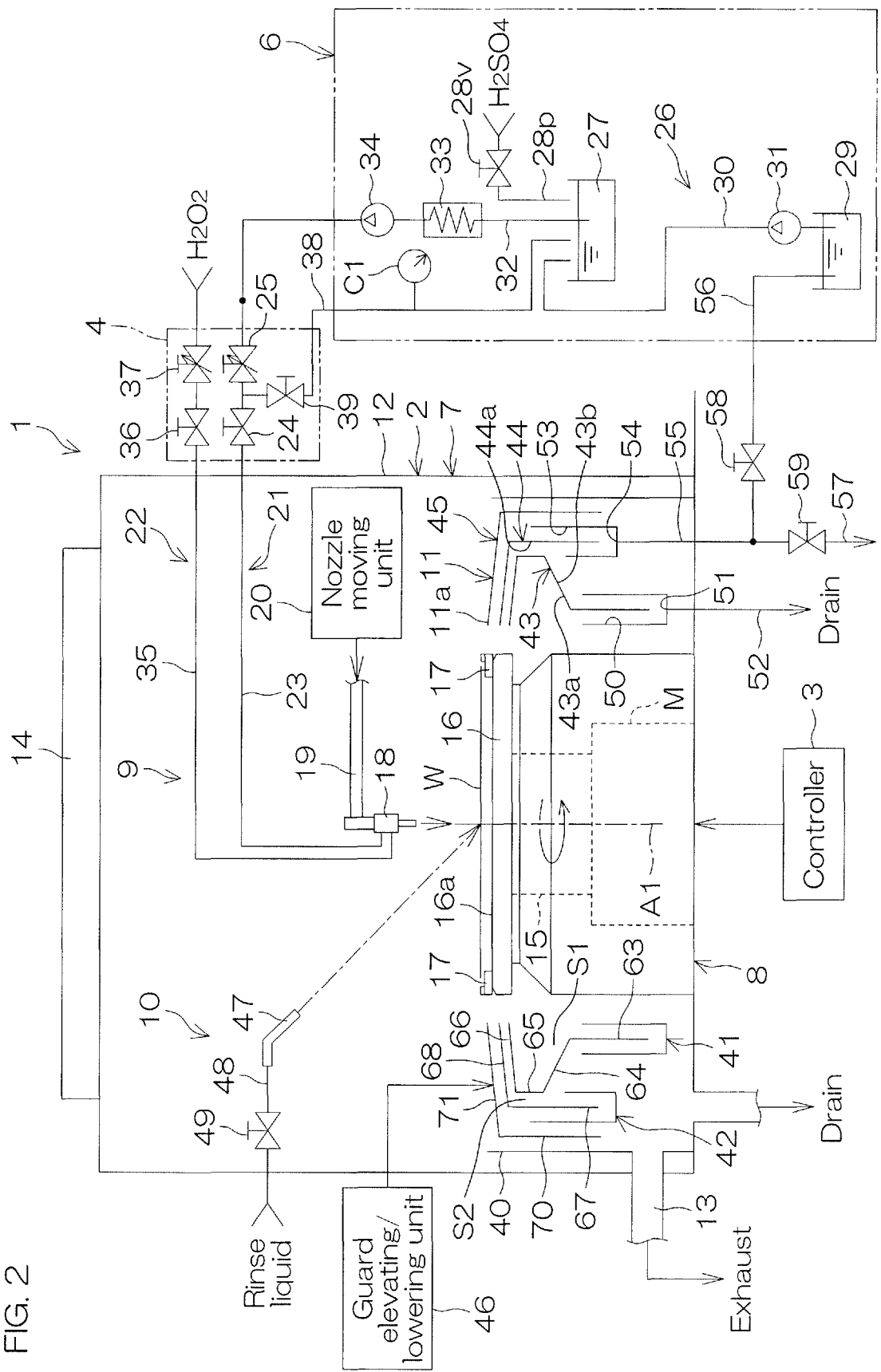
FIG. 2 is an illustrative sectional view for describing an arrangement example of a processing unit included in the substrate processing apparatus.

FIG. 2 is an illustrative sectional view for describing an arrangement example of a processing unit 2 included in the substrate processing apparatus 1.

The processing unit 2 includes a box-shaped chamber 7, having an internal space, a spin chuck (substrate holding unit) 8, holding a single substrate W in a horizontal orientation inside the chamber 7 and rotating the substrate W around a vertical rotational axis A1 passing through a center of the substrate W, an SPM supplying unit (chemical liquid supplying unit) 9, arranged to supply SPM (sulfuric acid/hydrogen peroxide mixture), as an example of a chemical liquid, to an upper surface of the substrate W held by the spin chuck 8, a rinse liquid supplying unit 10, arranged to supply a rinse liquid to the upper surface of the substrate W held by the spin chuck 8, and a cylindrical processing cup 11, surrounding the spin chuck 8.

The chamber 7 includes a box-shaped partition wall 12, an FFU (fan filter unit) 14 as a blower unit sending clean air to inside the partition wall 12 (corresponding to inside the chamber 7) from an upper portion of the partition wall 12, and an exhaust apparatus (not shown), exhausting gas inside the chamber 7 from a lower portion of the partition wall 12.

The FFU 14 is disposed above the partition wall 12 and is mounted to a ceiling of the partition wall 12. The FFU 14 sends the clean air to inside the chamber 7 from the ceiling of the partition wall 12. The exhaust apparatus (not shown) is connected to a bottom portion of the processing cup 11 via an exhaust duct 13, connected to the processing cup 11, and suctions gas inside the processing cup 11 from the bottom portion of the processing cup 11. A down flow (downward flow) is formed inside the chamber 7 by the FFU 14 and the exhaust apparatus (not shown).

As the spin chuck 8, a clamping type chuck, which clamps the substrate W in horizontal directions to hold the substrate W horizontally, is adopted. Specifically, the spin chuck 8 includes a spin motor (rotating unit) M, a spin shaft 15, made integral to a driveshaft of the spin motor M, and a disk-shaped spin base 16, mounted substantially horizontally on an upper end of the spin shaft 15.

The spin base 16 includes a horizontal, circular upper surface 16a, having an outer diameter greater than an outer diameter of the substrate W. A plurality (not less than three; for example, six) of clamping members 17 are disposed at a peripheral edge portion of the upper surface 16a. At the upper surface peripheral edge portion of the spin base 16, the plurality of clamping members 17 are disposed at suitable intervals on a circumference corresponding to an outer peripheral shape of the substrate W.

The SPM supplying unit 9 includes an SPM nozzle 18, discharging the SPM toward the upper surface of the substrate W, a nozzle arm 19, having the SPM nozzle 18 mounted on a tip portion, and a nozzle moving unit 20, moving the nozzle arm 19 to move the SPM nozzle 18. The SPM nozzle 18 is, for example, a straight nozzle that discharges the SPM in a continuous flow state. The SPM nozzle 18 is mounted on the nozzle arm 19, for example, in a perpendicular orientation of discharging the processing liquid in a direction perpendicular to the upper surface of the substrate W. The nozzle arm 19 extends in a horizontal direction.

The nozzle moving unit 20 makes the nozzle arm 19 move horizontally around a vertical swinging axis, set in a periphery of the processing cup 11, to move the SPM nozzle 18 horizontally. The nozzle moving unit 20 makes the SPM nozzle 18 move horizontally between a processing position, at which the SPM discharged from the SPM nozzle 18 lands on the upper surface of the substrate W, and a retreat position, at which the SPM nozzle 18 is set at a periphery of the spin chuck 8 in plan view. In the present preferred embodiment, the processing position is, for example, a central position, at which the SPM discharged from the SPM nozzle 18 lands at an upper surface central portion of the substrate W.

The SPM supplying unit 9 includes a sulfuric acid supplying unit 21, supplying the sulfuric acid ($H_2SO_4$) to the SPM nozzle 18. The sulfuric acid supplying unit 21 includes a sulfuric acid piping 23, having one end connected to the SPM nozzle 18, a sulfuric acid valve 24, arranged to open and close the sulfuric acid piping 23, a sulfuric acid flow control valve 25, adjusting an opening degree of the sulfuric acid piping 23 to adjust a flow rate of the sulfuric acid flowing through the sulfuric acid piping 23, and a sulfuric acid supply portion 26, to which the other end of the sulfuric acid piping 23 is connected. The sulfuric acid valve 24 and the sulfuric acid flow control valve 25 are housed inside a fluid box 4. The sulfuric acid supply portion 26 is housed in a storage box 6.

Although not illustrated, the sulfuric acid valve 24 includes a valve body, provided with an internal flow passage, through which a liquid flows, and an annular valve seat, surrounding the internal flow passage, a valve element, movable with respect to the valve seat, and an actuator, moving the valve element between a closed position, at which the valve element contacts the valve seat, and an open position, at which the valve element is separated from the valve seat. The same also applies to the other valves. The actuator may be a pneumatic actuator or an electric actuator or an actuator besides these. The controller 3 controls the actuator to open and close the sulfuric acid valve 24.

The sulfuric acid supply portion 26 includes a sulfuric acid tank 27, storing the sulfuric acid to be supplied to the sulfuric acid piping 23, a recovery tank 29, storing the sulfuric acid recovered from the processing cup 11, a liquid feeding piping 30, arranged to feed the sulfuric acid stored in the recovery tank 29 to the sulfuric acid tank 27, a first liquid feeding device 31, moving the sulfuric acid inside the recovery tank 29 to the liquid feeding piping 30, a sulfuric acid supply piping 32, connecting the sulfuric acid tank 27 and the sulfuric acid piping 23, a temperature controller 33, heating and thereby performing temperature control of the sulfuric acid flowing through the sulfuric acid supply piping 32, and a second liquid feeding device 34, moving the sulfuric acid inside the sulfuric acid tank 27 to the sulfuric acid supply piping 32.

The temperature controller 33 may be immersed inside the sulfuric acid in the sulfuric acid tank 27 or may be interposed at an intermediate portion of the sulfuric acid supply piping 32 as shown in FIG. 2. The sulfuric acid supply portion 26 may further include a filter, filtering the sulfuric acid flowing through the sulfuric acid supply piping 32, and/or a thermometer, measuring a temperature of the sulfuric acid flowing through the sulfuric acid supply piping 32. Although in the present preferred embodiment, the sulfuric acid supply portion 26 has two tanks, the recovery tank 29 may be omitted and the sulfuric acid recovered from the processing cup 11 may be supplied directly to the sulfuric acid tank 27. The first liquid feeding device 31 and the second liquid feeding device 34 are, for example, pumps. A pump draws in a liquid, such as the sulfuric acid, etc., and discharges the drawn-in liquid.

The sulfuric acid supply portion 26 includes a return piping 38, guiding the sulfuric acid from the sulfuric acid supply piping 32 to the sulfuric acid tank 27, and a return valve 39, opening and closing the return piping 38. An upstream end of the return piping 38 is connected to the sulfuric acid supply piping 32 at a position upstream the sulfuric acid valve 24, and a downstream end of the return piping 38 is connected to the sulfuric acid tank 27. When the sulfuric acid valve 24 is closed and the return valve 39 is opened, the sulfuric acid fed from the sulfuric acid tank 27 to the sulfuric acid supply piping 32 returns to the sulfuric acid tank 27 via the return tank 38. The sulfuric acid inside the sulfuric acid tank 27 is thereby circulated in an annular circulation passage formed by the sulfuric acid tank 27, the sulfuric acid supply piping 32, and the return piping 38.

The sulfuric acid supply portion 26 includes a sulfuric acid concentration meter C1, measuring a sulfuric acid concentration of the sulfuric acid in the sulfuric acid tank 27, a sulfuric acid replenishing piping 28p, replenishing fresh sulfuric acid to the sulfuric acid tank 27, and a sulfuric acid replenishing valve 28v, opening and closing the sulfuric acid replenishing piping 28p. The sulfuric acid concentration meter C1 may be mounted to the sulfuric acid tank 27 or may be mounted to the sulfuric acid supply piping 32 or the return piping 38. FIG. 2 shows an example where the sulfuric acid concentration meter C1 is mounted to the return piping 38. In this case, the sulfuric acid concentration meter C1 measures the sulfuric acid concentration of the sulfuric acid in the sulfuric acid tank 27 that is fed into the return piping 38 via the sulfuric acid supply piping 32.

The SPM supplying unit 9 includes a hydrogen peroxide water supplying unit 22, supplying hydrogen peroxide water ($H_2O_2$) to the SPM nozzle 18. The hydrogen peroxide water supplying unit 22 includes a hydrogen peroxide water piping 35, connected to the SPM nozzle 18, a hydrogen peroxide water valve 36, arranged to open and close the hydrogen peroxide water piping 35, and a hydrogen peroxide water flow control valve 37, adjusting an opening degree of the hydrogen peroxide water valve 36 to adjust a flow rate of the hydrogen peroxide water flowing through the hydrogen peroxide water valve 36. The hydrogen peroxide water valve 36 and the hydrogen peroxide water flow control valve 37 are housed inside the fluid box 4. Hydrogen peroxide water, which is approximately of ordinary temperature (20 to 30° C.) and is not temperature-controlled, is supplied from a hydrogen peroxide water supply source, housed in the storage box 6, to the hydrogen peroxide water piping 35.

When the sulfuric acid valve 24 and the hydrogen peroxide water valve 36 are opened, the sulfuric acid from the sulfuric acid piping 23 and the hydrogen peroxide water from the hydrogen peroxide water piping 35 are supplied to inside a casing (not shown) of the SPM nozzle 18 and are mixed (stirred) sufficiently inside the casing. By the mixing, the sulfuric acid and the hydrogen peroxide water are mixed uniformly, and the liquid mixture (SPM) of the sulfuric acid and the hydrogen peroxide water is formed by reaction of the sulfuric acid and the hydrogen peroxide water. The SPM contains peroxymonosulfuric acid ($H_2SO_5$) of strong oxidizing power and is temperature-raised to a temperature (of not less than 100° C.; for example, 160 to 220° C.) higher than the temperatures of the sulfuric acid and the hydrogen peroxide water before mixing. The high-temperature SPM that is formed is discharged from a discharge port opening at a tip (for example, a lower end) of the casing of the SPM nozzle 18.

A flow rate of the sulfuric acid supplied to the SPM nozzle 18 is changed by the sulfuric acid flow control valve 25. A flow rate of the hydrogen peroxide water supplied to the SPM nozzle 18 is changed by the hydrogen peroxide water flow control valve 37. A mixing ratio of the sulfuric acid and the hydrogen peroxide water is thus changed by the sulfuric acid flow control valve 25 and the hydrogen peroxide water flow control valve 37. The mixing ratio of the sulfuric acid and the hydrogen peroxide water (flow ratio of the sulfuric acid and the hydrogen peroxide water) is adjusted within a range, for example, of 30:1 (sulfuric acid:hydrogen peroxide water) to 2:1 (sulfuric acid:hydrogen peroxide water).

The rinse liquid supplying unit 10 includes a rinse liquid nozzle 47 that discharges a rinse liquid toward the upper surface of the substrate W. The rinse liquid nozzle 47 is, for example, a straight nozzle that discharges a liquid in a continuous flow state. The rinse liquid nozzle 47 is a fixed nozzle that is fixed with respect to the partition wall 12 of the chamber 7. A discharge port of the rinse liquid nozzle 47 is directed toward the upper surface central portion of the substrate W. The rinse liquid nozzle 47 may be a scan nozzle that is movable inside the chamber 7. That is, the rinse liquid supplying unit 10 may include a nozzle moving unit that moves the rinse liquid nozzle 47 to move, within the upper surface of the substrate W, a liquid landing position of the rinse liquid with respect to the upper surface of the substrate W.

The rinse liquid nozzle 47 is connected to a rinse liquid piping 48, guiding the rinse liquid from a rinse liquid supply source. A rinse liquid valve 49, arranged to switch between supplying and stopping the supply of the rinse liquid from the rinse liquid nozzle 47, is interposed in an intermediate portion of the rinse liquid piping 48. When the rinse liquid valve 49 is opened, the rinse liquid is supplied from the rinse liquid piping 48 to the rinse liquid nozzle 47 and discharged from the discharge port provided at a lower end of the rinse liquid nozzle 47.

When the rinse liquid valve 49 is closed, the supply of the rinse liquid from the rinse liquid piping 48 to the rinse liquid nozzle 47 is stopped. The rinse liquid is, for example, deionized water (DIW), but is not restricted to DIW and may instead be any of carbonated water, electrolyzed ion water, hydrogen water, ozone water, ammonia water, and aqueous hydrochloric acid solution of dilute concentration (for example, approximately 10 ppm to 100 ppm). The rinse liquid may be of ordinary temperature (20 to 30° C.) or may be heated before being supplied to the substrate W.

The processing cup 11 is disposed further outward (in directions away from the rotational axis A1) than the substrate W held by the spin chuck 8. The processing cup 11 surrounds lateral sides of the spin base 16. When, in a state where the spin chuck 8 is rotating the substrate W, a processing liquid is supplied to the substrate W, the processing liquid supplied to the substrate W is spun off to a periphery of the substrate W. When the processing liquid is supplied to the substrate W, an upper end portion 11a of the upwardly-open processing cup 11 is disposed higher than the spin base 16. Therefore, the processing liquid, such as the chemical liquid, water, etc., expelled to the periphery of the substrate W is received by the processing cup 11. The processing liquid received by the processing cup 11 is fed to the recovery tank 29 or an unillustrated waste liquid apparatus.

The processing cup 11 includes a plurality of cylindrical guards 43 to 45 (first, second, and third guards 43, 44, and 45), receiving the processing liquid (the chemical liquid or the rinse liquid) that scattered to the periphery of the substrate W, a plurality of annular cups 41 and 42, receiving the processing liquid guided by the plurality of guards 43 to 45, and a circular cylindrical member 40, surrounding the plurality of guards 43 to 45 and the plurality of cups 41 and 42.

The processing cup 11 further includes a guard elevating/lowering unit 46, elevating and lowering each of the guards 43 to 45 independently. The guard elevating/lowering unit 46 includes, for example, an electric motor that generates motive power and a ball-screw mechanism, transmitting the motive power of the electric motor to any of the guards 43 to 45. When the guard elevating/lowering unit 46 elevates or lowers at least one of the three guards 43 to 45, a state of the processing cup 11 is switched.

As shall be described below, the state of the processing cup 11 is switched to one state among a retreated state (state shown in FIG. 2), in which upper ends of all of the guards 43 to 45 are disposed lower than the substrate W, a first facing state, in which the first guard 43 faces a peripheral end surface of the substrate W, a second facing state, in which the second guard 44 faces a peripheral end surface of the substrate W, and a third facing state, in which the third guard 45 faces a peripheral end surface of the substrate W.

The first cup 41 surrounds the spin chuck 8 at an inner side of the circular cylindrical member 40. The first cup 41 demarcates an annular first groove 50, into which flows the processing liquid used to process the substrate W. A drain port 51 is opened at a lowest location of a bottom portion of the first groove 50 and a first drain piping 52 is connected to the drain port 51. The processing liquid led into the first drain piping 52 is fed to a draining apparatus and processed by the apparatus.

The second cup 42 surrounds the first cup 41 at the inner side of the circular cylindrical member 40. The second cup 42 demarcates an annular second groove 53, into which flows the processing liquid used to process the substrate W. A drain/recovery port 54 is opened at a lowest location of a bottom portion of the second groove 53 and a common piping 55 is connected to the drain/recovery port 54. A recovery piping 56 and a second drain piping 57 branch from the common piping 55. An upstream end of the recovery piping 56 is connected to the common piping 55 and a downstream end of the recovery piping 56 is connected to the recovery tank 29 of the sulfuric acid supply portion 26.

A recovery valve 58 is interposed in the recovery piping 56 and a drain valve 59 is interposed in the second drain piping 57. By the drain valve 59 being closed and the recovery valve 58 being opened, the liquid flowing through the common piping 55 is led to the recovery piping 56. Also, by the drain valve 59 being opened and the recovery valve 58 being closed, the liquid flowing through the common piping 55 is led to the second drain piping 57. The recovery valve 58 and the drain valve 59 are included in a recovery/drain switching unit that switches the piping, into which the liquid expelled from the substrate W flows, between the recovery piping 56 and the second drain piping 57.

The innermost first guard 43 surrounds the spin chuck 8 at the inner side of the circular cylindrical member 40. The first guard 43 includes a lower end portion 63 of circular cylindrical shape that surrounds the periphery of the spin chuck 8, a cylindrical portion 64, extending outward (in directions away from the rotational axis A1 of the substrate W) from an upper end of the lower end portion 63, an intermediate portion 65 of circular cylindrical shape that extends vertically upward from an upper end of the cylindrical portion 64, and an upper end portion 66 of circular annular shape extending obliquely upward and inward (in directions of approaching the rotational axis A1 of the substrate W) from an upper end of the intermediate portion 65.

The lower end portion 63 of the first guard 43 is positioned above the first groove 50 of the first cup 41. An inner peripheral end of the upper end portion 66 of the first guard 43 defines a circle with a diameter greater than the substrate W, held by the spin chuck 8, in plan view. A cross-sectional shape of the upper end portion 66 of the first guard 43 is a rectilinear shape as shown in FIG. 2. The cross-sectional shape of the upper end portion 66 may be a circular arc or other shape besides a rectilinear shape.

The second guard 44, which is second from the inner side, surrounds the first guard 43 at the inner side of the circular cylindrical member 40. The second guard 44 has a circular cylindrical portion 67, surrounding the first guard 43, and an upper end portion 68 of circular annular shape that extends obliquely upward and toward the center (in directions of approaching the rotational axis A1 of the substrate W) from an upper end of the circular cylindrical portion 67. The circular cylindrical portion 67 of the second guard 44 is positioned above the second groove 53 of the second cup 42.

An inner peripheral end of the upper end portion 68 of the second guard 44 defines a circle with a diameter greater than the substrate W, held by the spin chuck 8, in plan view. A cross-sectional shape of the upper end portion 68 of the second guard 44 is a rectilinear shape. The cross-sectional shape of the upper end portion 68 may be a circular arc or other shape besides a rectilinear shape. The upper end portion 68 of the second guard 44 overlaps with the upper end portion 66 of the first guard 43 in an up-down direction. The upper end portion 68 of the second guard 44 is formed such as to be disposed close to the upper end portion 66 of the first guard 43 while maintaining a minute gap with respect thereto in a state where the first guard 43 and the second guard 44 are disposed closest to each other.

The third guard 45, which is third from the inner side, surrounds the second guard 44 at the inner side of the circular cylindrical member 40. The third guard 45 has a circular cylindrical portion 70, surrounding the second guard 44, and an upper end portion 71 of circular annular shape that extends obliquely upward and toward the center (in directions of approaching the rotational axis A1 of the substrate W) from an upper end of the circular cylindrical portion 70. An inner peripheral end of the upper end portion 71 defines a circle with a diameter greater than the substrate W, held by the spin chuck 8, in plan view. A cross-sectional shape of the upper end portion 71 is a rectilinear shape. The cross-sectional shape of the upper end portion 71 maybe a circular arc or other shape besides a rectilinear shape.

A first flow space (in other words, a drain space) S1, through which the chemical liquid used to process the substrate W is guided, is demarcated by the first groove 50 of the first cup 41, an inner wall 43a of the first guard 43, and an outer periphery of a casing of the spin chuck 8. A second flow space (in other words, a recovery space) S2, through which the chemical liquid used to process the substrate W is guided, is demarcated by the second groove 53 of the second cup 42, an outer wall 43b of the first guard 43, and an inner wall 44a of the second guard 44. The first flow space S1 and the second flow space S2 are separated from each other by the first guard 43.

The guard elevating/lowering unit 46 elevates and lowers each of the guards 43 to 45 between an upper position, at which the upper end portions of the guards 43 to 45 are positioned higher than the substrate W, and a lower position, at which the upper end portions of the guards 43 to 45 are positioned lower than the substrate W. The guard elevating/lowering unit 46 is capable of holding each of the guards 43 to 45 at any position between the upper position and the lower position. The supply of the processing liquid to the substrate W is performed in a state where any of the guards 43 to 45 faces a peripheral end surface of the substrate W.

In the first facing state of the processing cup 11, in which the innermost first guard 43 is made to face the peripheral end surface of the substrate W, all of the first to third guards 43 to 45 are disposed at the upper positions (processing height positions). In the second facing state of the processing cup 11, in which the second guard 44 that is second from the inner side is made to face the peripheral end surface of the substrate W, the second and third guards 44 and 45 are disposed at the upper positions and the first guard 43 is disposed at the lower position. In the third facing state of the processing cup 11, in which the outermost third guard 45 is made to face the peripheral end surface of the substrate W, the third guard 45 is disposed at the upper position and the first and second guards 43 and 44 are disposed at the lower positions. In the retreated state (see FIG. 2), in which all of the guards 43 to 45 are retreated from the peripheral end surface of the substrate W, all of the first to third guards 43 to 45 are disposed at the lower positions.

As shall be described below, when the processing cup 11 is switched from the first facing state to the second facing state, the first guard 43 is disposed at a cleaning height position, between the upper position and the lower position, in a state where the second and third guards 44 and 45 are disposed at the upper positions. This state is a transition state in which the processing cup 11 is switched from the first facing state to the second facing state. The processing cup 11 is switched to any of plurality states including the first to third facing states, the retreated state, and the transition state. The transition state is a state in which the first guard 43 faces the peripheral end surface of the substrate W.

Figure 3:
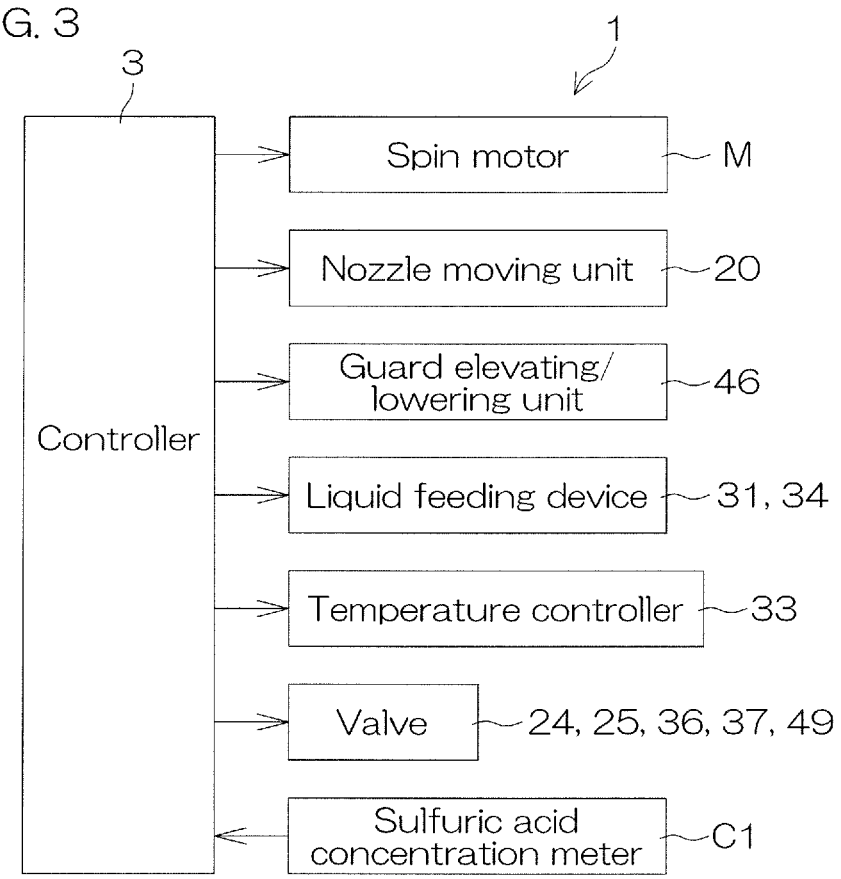
FIG. 3 is a block diagram for describing an electrical configuration of the substrate processing apparatus.

FIG. 3 is a block diagram for describing an electrical configuration of the substrate processing apparatus 1.

The controller 3 is, for example, a computer. The controller 3 has a computing unit, such as CPU, etc., a storage unit, such as a fixed memory device, a hard disk drive, etc., and an input/output unit, at which input and output of information are performed. The storage unit includes a computer-readable recording medium, recording a computer program executed by the computing unit. A step group is incorporated in the recording medium such as to make the controller 3 execute a resist removing processing described below.

The controller 3 controls operations of the spin motor M, the nozzle moving unit 20, the guard elevating/lowering unit 46, the first liquid feeding device 31, the second liquid feeding device 34, the temperature controller 33, etc., in accordance with a predetermined program. Also, the controller 3 controls opening/closing operations of the sulfuric acid valve 24, the hydrogen peroxide water valve 36, the rinse liquid valve 49, etc., in accordance with the predetermined program. Also, the controller 3 adjusts opening degrees of the sulfuric acid flow control valve 25 and the hydrogen peroxide water flow control valve 37 in accordance with the predetermined program. A measurement value of the sulfuric acid concentration meter C1 is input into the controller 3.

Figure 4:
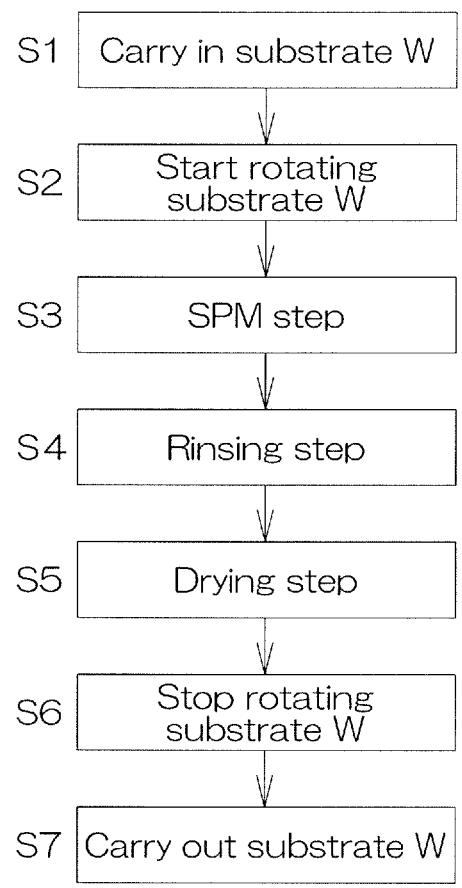
FIG. 4 is a flowchart for describing an example of processing of a substrate performed by the substrate processing apparatus.

FIG. 4 is a flowchart for describing an example of processing of a substrate W performed by the substrate processing apparatus 1.

The example processing of the substrate W shall now be described with reference to FIG. 1 to FIG. 4. The present example of processing of the substrate W is a resist removing processing of removing a resist from the upper surface (major surface) of the substrate W. The resist is, for example, a photoresist formed by a carbon-containing compound.

When the substrate W is processed by the substrate processing apparatus 1, the controller 3 makes a hand of the substrate transfer robot CR (see FIG. 1) that holds the substrate W, with at least a portion of the front surface (device forming surface) of the substrate W being covered by the resist, enter into the interior of the chamber 7 in a state where all of the nozzles are retreated from above the spin chuck 8 and all of the guards 43 to 45 are positioned at the lower positions. The substrate W is thereby delivered, in a state where its front surface is faced upward, to the spin chuck 8 and is held by the spin chuck 8 (substrate holding step).

After the substrate W is held by the spin chuck 8, the controller 3 makes the spin motor M start rotating. Rotation of the substrate W is thereby started (S2 of FIG. 4; substrate rotating step). The substrate W is raised in rotational speed to a predetermined liquid processing speed (within a range of 300 to 1500 rpm and of, for example, 500 rpm) and maintained at the liquid processing speed. When the rotational speed of the substrate W reaches the liquid processing speed, the controller 3 executes an SPM step (chemical liquid supplying step) S3.

Specifically, the controller 3 controls the nozzle moving unit 20 to move the SPM nozzle 18 from the retreat position to the processing position. Also, the controller 3 opens the sulfuric acid valve 24 and the hydrogen peroxide water valve 36 at the same time. Thereby, the sulfuric acid is supplied to the SPM nozzle 18 through the sulfuric acid piping 23 and the hydrogen peroxide water is supplied to the SPM nozzle 18 through the hydrogen peroxide water piping 35. The sulfuric acid and the hydrogen peroxide water are mixed in an interior of the SPM nozzle 18 and SPM of high temperature (for example, 160 to 220° C.) is formed. The SPM is discharged from the discharge port of the SPM nozzle 18 and lands on the upper surface central portion of the substrate W.

After landing on the upper surface of the substrate W, the SPM discharged from the SPM nozzle 18 flows outward along the upper surface of the substrate W due to a centrifugal force. The SPM is thus supplied to the entire upper surface of the substrate W and a liquid film of the SPM covering the entire upper surface of the substrate W is formed on the substrate W. Thereby, the resist and the SPM react chemically and the resist on the substrate W is removed from the substrate W by the SPM. The SPM that moved to a peripheral edge portion of the substrate W scatters toward lateral sides of the substrate W from the peripheral edge portion of the substrate W.

Also, in the SPM step S3, the controller 3 may control the nozzle moving unit 20 to move the SPM nozzle 18 between a peripheral edge position of facing a peripheral edge portion of the upper surface of the substrate W and a central position of facing the central portion of the upper surface of the substrate W instead. In this case, a liquid landing position of the SPM on the upper surface of the substrate W passes through the entire upper surface of the substrate W and therefore the entire upper surface of the substrate W is scanned by the liquid landing position of the SPM. The entire upper surface of the substrate W is thereby processed uniformly.

When a predetermined period elapses from start of discharge of the SPM, the controller 3 closes the sulfuric acid valve 24 and the hydrogen peroxide water valve 36 to stop the discharge of the SPM from the SPM nozzle 18. The SPM step S3 thereby ends. Thereafter, the controller 3 controls the nozzle moving unit 20 (see FIG. 2) to return the SPM nozzle 18 to the retreat position.

Next, a rinsing step (S4 of FIG. 4) of supplying the rinse liquid to the substrate W is performed. Specifically, the controller 3 opens the rinse liquid valve 49 to make the rinse liquid be discharged from the rinse liquid nozzle 47 toward the upper surface central portion of the substrate W. The rinse liquid discharged from the rinse liquid nozzle 47 lands on the upper surface central portion of the substrate W that is covered by the SPM. The rinse liquid that landed on the upper surface central portion of the substrate W receives the centrifugal force due to the rotation of the substrate W and flows on the upper surface of the substrate W toward the peripheral edge portion of the substrate W. The SPM on the substrate W is thereby washed away outwardly by the rinse liquid and expelled to the periphery of the substrate W. The SPM and the resist (that is, the resist residue) are consequently rinsed off from the entire upper surface of the substrate W. When a predetermined period elapses from start of the rinsing step S4, the controller 3 closes the rinse liquid valve 49 to stop the discharge of the rinse liquid from the rinse liquid nozzle 47.

Next, a drying step (S5 of FIG. 4) of drying the substrate W is performed. Specifically, the controller 3 controls the spin motor M to accelerate the substrate W to a drying rotational speed (of, for example, several thousand rpm) that is greater than the rotational speed up to the SPM step S3 and the rinsing step S4 and rotate the substrate W at the drying rotational speed. A large centrifugal force is thereby applied to the liquid on the substrate W and the liquid attached to the substrate W is spun off to the periphery of the substrate W. The liquid is thereby removed from the substrate W and the substrate W dries. Then, when a predetermined time elapses from the point at which high-speed rotation of the substrate W is started, the controller 3 stops the spin motor M to stop the rotation of the substrate W by the spin chuck 8 (S6 of FIG. 4).

Next, the substrate W is carried out from inside the chamber 7 (S7 of FIG. 4). Specifically, the controller 3 makes the hand of the substrate transfer robot CR enter into the interior of the chamber 7 in the state where all of the guards 43 to 45 are positioned at the lower positions. The controller 3 then makes the hand of the substrate transfer robot CR hold the substrate W on the spin chuck 8. Thereafter, the controller 3 makes the hand of the substrate transfer robot CR retreat from inside the chamber 7. The substrate W, with which the resist has been removed from the front surface (device forming surface), is thereby carried out from the chamber 7.

Transition of the mixing ratio of the sulfuric acid and the hydrogen peroxide water, operations of the first guard 43 and the second guard 44, etc., in the SPM step (S3 of FIG. 4) shall now be described.

Figure 5:
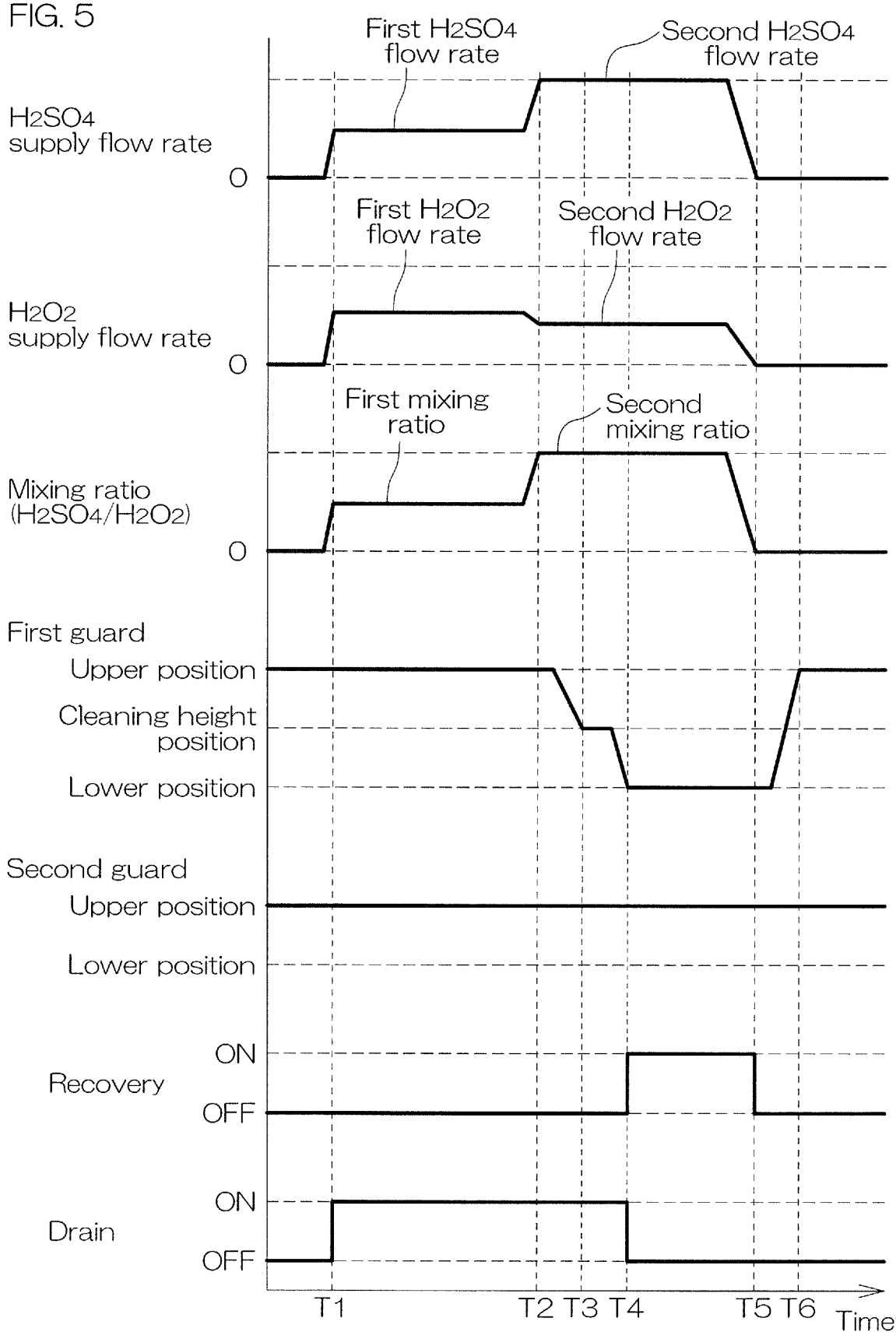
FIG. 5 is a timing chart showing transition of a mixing ratio of sulfuric acid and hydrogen peroxide water, operations of a first guard and a second guard, etc., in an SPM step.

FIG. 5 is a timing chart showing the transition of the mixing ratio of the sulfuric acid and the hydrogen peroxide water, the operations of the first guard 43 and the second guard 44, etc., in the SPM step (S3 of FIG. 4). In FIG. 5, ON of recovery represents that the SPM expelled from the substrate W flows into the recovery piping 56 via the second guard 44 and OFF of recovery represents that the flow of the SPM into the recovery piping 56 is stopped. In FIG. 5, ON of drain represents that the SPM expelled from the substrate W flows into the first drain piping 52 via the first guard 43 and OFF of drain represents that the flow of the SPM into the first drain piping 52 is stopped. FIG. 2 and FIG. 5 shall be referenced in the following description. The following operations, etc., are executed by the controller 3 controlling the substrate processing apparatus 1. In other words, the controller 3 is programmed to execute the following operations, etc.

When the sulfuric acid valve 24 and the hydrogen peroxide water valve 36 are opened at a time T1 shown in FIG. 5, the sulfuric acid is supplied at a first $H_2SO_4$ flow rate to the SPM nozzle 18 and the hydrogen peroxide water is supplied at a first $H_2O_2$ flow rate to the SPM nozzle 18. The sulfuric acid and the hydrogen peroxide water are thus mixed at a first mixing ratio (first $H_2SO_4$ flow rate/first $H_2O_2$ flow rate) inside the SPM nozzle 18. A first SPM is thereby prepared inside the SPM nozzle 18 and discharged toward the upper surface of the substrate W from the SPM nozzle 18. Consequently, a liquid film of the first SPM, covering the entire upper surface of the substrate W, is formed.

When a predetermined time elapses from when the sulfuric acid valve 24 and the hydrogen peroxide water valve 36 are opened, the opening degree of at least one of the sulfuric acid flow control valve 25 and the hydrogen peroxide water flow control valve 37 is changed at a time T2 shown in FIG. 5 and the sulfuric acid and the hydrogen peroxide water become mixed at a second mixing ratio (second $H_2SO_4$ flow rate/second $H_2O_2$ flow rate), greater than the first mixing ratio, inside the SPM nozzle 18. FIG. 5 shows an example where the opening degrees of both the sulfuric acid flow control valve 25 and the hydrogen peroxide water flow control valve 37 are changed. A second SPM is thereby prepared inside the SPM nozzle 18 and discharged toward the upper surface of the substrate W from the SPM nozzle 18. Consequently, the liquid film of the first SPM, covering the entire upper surface of the substrate W, is replaced by a liquid film of the second SPM, covering the entire upper surface of the substrate W.

In the example shown in FIG. 5, the sulfuric acid is supplied to the SPM nozzle 18 at the second $H_2SO_4$ flow rate greater than the first $H_2SO_4$ flow rate, and the hydrogen peroxide water is supplied to the SPM nozzle 18 at the second $H_2O_2$ flow rate less than the first $H_2O_2$ flow rate. The second $H_2SO_4$ flow rate and the second $H_2O_2$ flow rate may be set such that a flow rate of the SPM discharged from the SPM nozzle 18 is kept constant even when the mixing ratio (ratio of the sulfuric acid with respect to the hydrogen peroxide water) is changed or may be set such that the flow rate of the SPM discharged from the SPM nozzle 18 increases or decreases. The mixing ratio is changed continuously from the first mixing ratio to the second mixing ratio. The SPM supplied to the upper surface of the substrate W thus changes continuously from a state of being high in hydrogen peroxide water concentration to a state of being high in sulfuric acid concentration.

Figure 8:
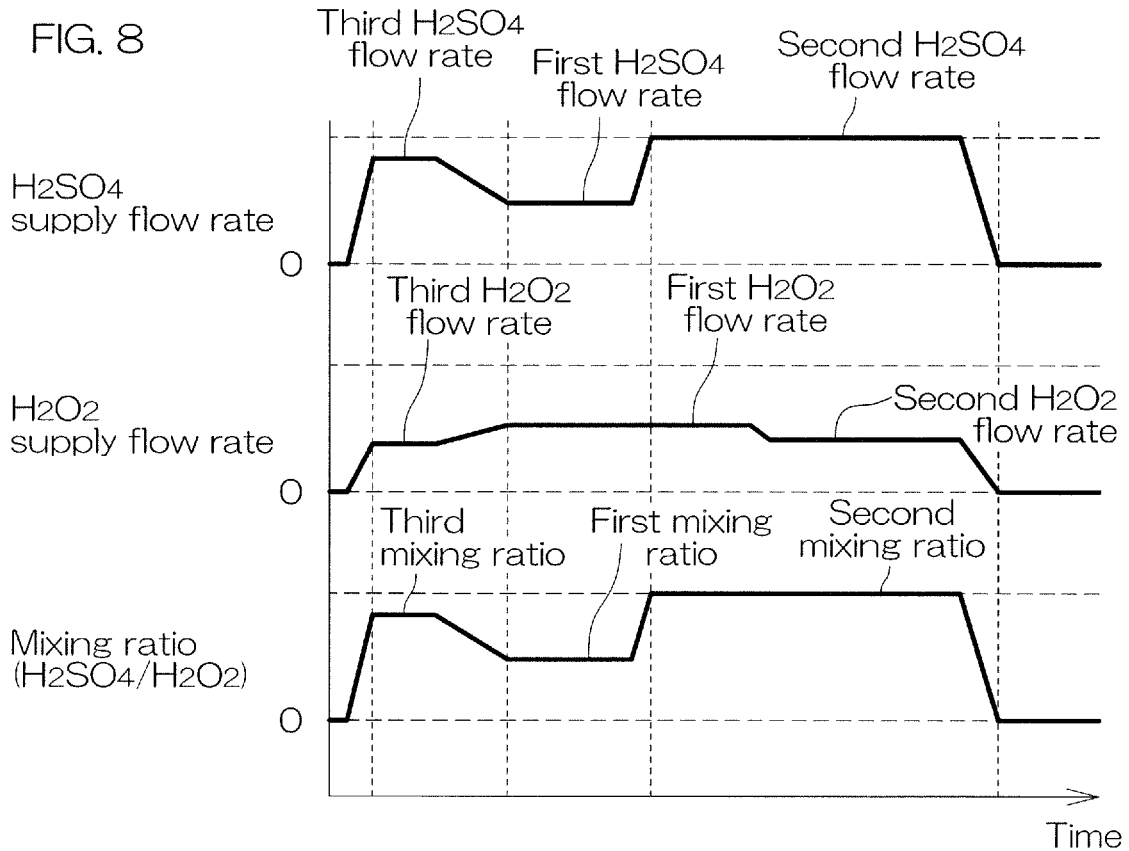
FIG. 8 is a timing chart, according to a second preferred embodiment of the present invention, of transition of the mixing ratio of the sulfuric acid and the hydrogen peroxide water in the SPM step.

When a predetermined time elapses from when the SPM mixing ratio is changed to the second mixing ratio, the sulfuric acid valve 24 and the hydrogen peroxide water valve 36 are closed at a time T5 shown in FIG. 5 and the discharge of the SPM from the SPM nozzle 18 is stopped. FIG. 5 shows an example where a time over which the SPM mixing ratio is set to the first mixing ratio (time from the time T1 to the time T2) is longer than a time over which the SPM mixing ratio is set to the second mixing ratio (time from the time T2 to the time T5). The time over which the SPM mixing ratio is set to the first mixing ratio may be equal to the time over which the SPM mixing ratio is set to the second mixing ratio or may be shorter than the time over which the SPM mixing ratio is set to the second mixing ratio. FIG. 8 shows an example of the latter.

As shown in FIG. 5, the processing cup 11 is set to the first facing state, in which the innermost first guard 43 among the three guards 43 to 45 faces the peripheral end surface of the substrate W, before the SPM nozzle 18 starts discharge of the first SPM (before the time T1 shown in FIG. 5). The first SPM expelled from the substrate W is thus received by the inner wall 43a of the first guard 43 and guided to the first cup 41. The first SPM inside the first cup 41 is drawn off to the first drain piping 52 (ON of drain shown in FIG. 5).

As shown in FIG. 5, at a point at which the SPM mixing ratio is changed to the second mixing ratio (time T2 shown in FIG. 5), the first guard 43 is positioned at the upper position. The second SPM expelled from the substrate W is thus received by the inner wall 43a of the first guard 43 and guided to the first cup 41. After the SPM mixing ratio is changed to the second mixing ratio, the guard elevating/lowering unit 46 lowers the first guard 43 to the cleaning height position, between the upper position and the lower position, at a time T3 shown in FIG. 5. A position at which the second SPM hits the inner wall 43a of the first guard 43 directly is thereby moved upward with respect to the first guard 43.

For example, after keeping the first guard 43 still at the cleaning height position for a predetermined time, the guard elevating/lowering unit 46 lowers the first guard 43 to the lower position at a time T4 shown in FIG. 5. The processing cup 11 is thus switched to the second facing state, in which the second guard 44 faces the peripheral end surface of the substrate W, in the state where the SPM nozzle 18 discharges the second SPM and the entire upper surface of the substrate W is covered by the liquid film of the second SPM. The second SPM expelled from the substrate W is received by the inner wall 44a of the second guard 44 and guided to the second cup 42. The second SPM inside the second cup 42 is then fed to the recovery tank 29 via the common piping 55 and the recovery piping 56. The second SPM supplied to the substrate W is thereby recovered (ON of recovery shown in FIG. 5).

When the discharge of the SPM from the SPM nozzle 18 is stopped at the time T5 shown in FIG. 5, the guard elevating/lowering unit 46 elevates the first guard 43 from the lower position to the upper position at a time T6 shown in FIG. 5. The processing cup 11 is thereby switched to the first facing state, in which the first guard 43 faces the peripheral end surface of the substrate W, in a state where the SPM nozzle 18 has stopped discharging the SPM and the entire upper surface of the substrate W is covered by the liquid film of the SPM. The rinsing step (S4 of FIG. 4) of supplying the rinse liquid to the substrate W is performed in this state. The drying step (S5 of FIG. 4) of drying the substrate W is performed in a state where the processing cup 11 is set in the third facing state, in which the third guard 45 faces the peripheral end surface of the substrate W.

Figure 6:
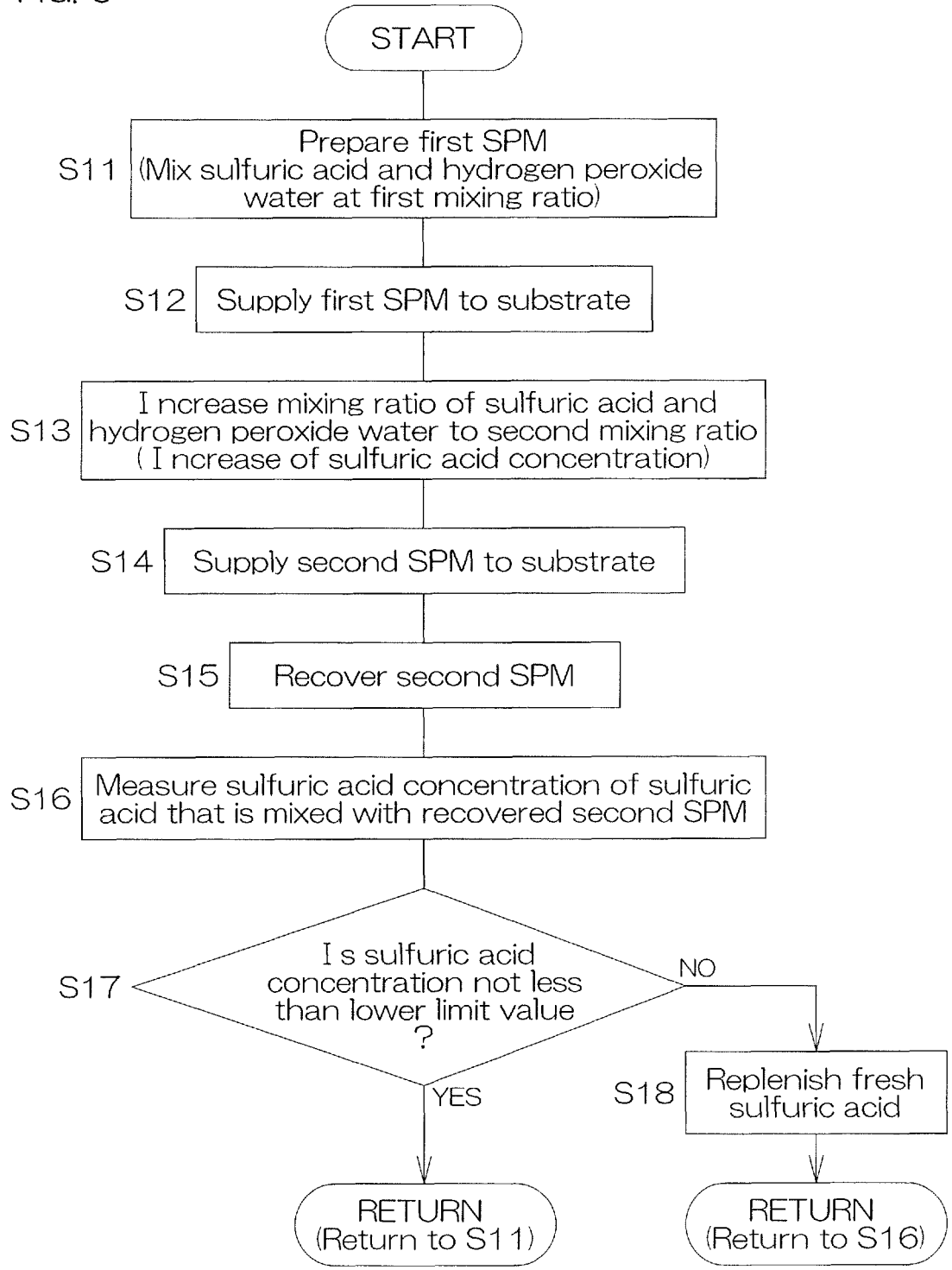
FIG. 6 is a flowchart showing a process flow when the sulfuric acid and the hydrogen peroxide water are mixed to prepare SPM and the SPM recovered from a substrate is supplied to another substrate.

FIG. 6 is a flowchart showing a process flow when the sulfuric acid and the hydrogen peroxide water are mixed to prepare the SPM and the SPM recovered from the substrate W is supplied to another substrate W. FIG. 2 and FIG. 6 shall be referenced in the following description. The following operations, etc., are executed by the controller 3 controlling the substrate processing apparatus 1. In other words, the controller 3 is programmed to execute the following operations, etc.

As mentioned above, in starting the SPM step (S3 of FIG. 4), the sulfuric acid and the hydrogen peroxide water are mixed at the first mixing ratio to prepare the first SPM as shown in FIG. 6 (S11 of FIG. 6). The first SPM is discharged from the SPM nozzle 18 and supplied to the substrate W (S12 of FIG. 6). The first SPM expelled from the substrate W is guided to the first drain piping 52 via the first guard 43 and the first cup 41.

When a predetermined time elapses from when the discharge of the first SPM is started, the mixing ratio of the sulfuric acid and the hydrogen peroxide water (ratio of the flow rate of the sulfuric acid before mixing with respect to the flow rate of the hydrogen peroxide water before mixing) is increased from the first mixing ratio to the second mixing ratio (S13 of FIG. 6). The sulfuric acid and the hydrogen peroxide water are thereby mixed at the second mixing ratio and the second SPM is prepared. Thereafter, the second SPM is supplied to the substrate W (S14 of FIG. 6) and expelled from the substrate W. The second SPM expelled from the substrate W is recovered in the recovery tank 29 via the second guard 44, the second cup 42, the common piping 55, and the recovery piping 56 (S15 of FIG. 6).

The second SPM recovered in the recovery tank 29 is fed to the sulfuric acid tank 27 storing the sulfuric acid.

Although the second SPM recovered in the recovery tank 29 contains components besides the sulfuric acid, not less than half of it is the sulfuric acid. The sulfuric acid contained in the second SPM recovered in the recovery tank 29 is mixed with the sulfuric acid inside the sulfuric acid tank 27. The sulfuric acid concentration of the sulfuric acid inside the sulfuric acid tank 27 is measured by the sulfuric acid concentration meter C1 (S16 of FIG. 6). The controller 3 monitors the sulfuric acid concentration of the sulfuric acid inside the sulfuric acid tank 27 based on the measurement value of the sulfuric acid concentration meter C1 (S17 of FIG. 6).

If the sulfuric acid concentration of the sulfuric acid measured by the sulfuric acid concentration meter C1 is not less than a lower limit value (Yes in S17 of FIG. 6), the controller 3 supplies the sulfuric acid inside the sulfuric acid tank 27 to the SPM nozzle 18 again. The sulfuric acid contained in the second SPM expelled from the substrate W is thereby mixed with the hydrogen peroxide water and fresh SPM is prepared. The fresh SPM is then supplied to the subsequent substrate W. The SPM expelled from the substrate W is thereby reused and a disposal amount of the SPM can thus be reduced.

On the other hand, if the sulfuric acid concentration of the sulfuric acid measured by the sulfuric acid concentration meter C1 falls below the lower limit value (No in S17 of FIG. 6), the controller 3 opens the sulfuric acid replenishing valve 28v, interposed in the sulfuric acid replenishing piping 28p, to replenish sulfuric acid into the sulfuric acid tank 27 (S18 of FIG. 6). The replenishing sulfuric acid is unused sulfuric acid (for example, concentrated sulfuric acid) and a sulfuric acid concentration thereof is higher than the sulfuric acid concentration of the sulfuric acid inside the sulfuric acid tank 27. Therefore, by the unused sulfuric acid being replenished into the sulfuric acid tank 27, the sulfuric acid concentration of the sulfuric acid inside the sulfuric acid tank 27 increases. After closing the sulfuric acid replenishing valve 28v, the controller 3 checks again whether or not the sulfuric acid concentration of the sulfuric acid falls below the lower limit value (returns to S16 of FIG. 6). A state in which the sulfuric acid concentration of the sulfuric acid inside the sulfuric acid tank 27 is high is thereby maintained.

Figure 7:
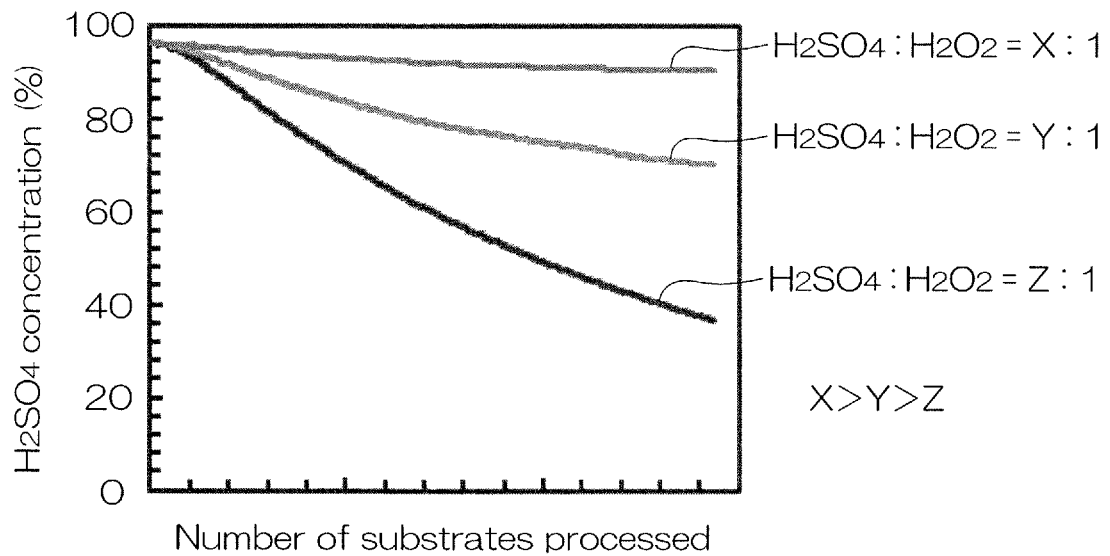
FIG. 7 is a graph showing transition of concentration of recovered sulfuric acid.

FIG. 7 is a graph showing transition of the concentration of the recovered sulfuric acid. The ordinate of FIG. 7 indicates the concentration of the recovered sulfuric acid. The abscissa of FIG. 7 indicates the number of substrates W processed by the substrate processing apparatus 1. Each of a ratio X, a ratio Y, and a ratio Z in FIG. 7 indicates a ratio of the flow rate of the sulfuric acid with respect to the flow rate of the hydrogen peroxide water, wherein the denominator (the flow rate of the hydrogen peroxide water) and the numerator (the flow rate of the sulfuric acid) are divided by the denominator. The ratio X is greater than the ratio Y and the ratio Y is greater than the ratio Z (ratio X>ratio Y>ratio Z).

As can be understood from FIG. 7, in all cases where the sulfuric acid ratio is the ratio X, the ratio Y, or the ratio Z, the sulfuric acid concentration decreases as the number of substrates W processed increases. A rate of decrease of the sulfuric acid concentration is higher, the lower the sulfuric acid ratio. That is, the rate of decrease of the sulfuric acid concentration is highest when the sulfuric acid ratio is the ratio Z, and the rate of decrease of the sulfuric acid concentration is second highest when the sulfuric acid ratio is the ratio Y. In other words, the sulfuric acid concentration is unlikely to decrease when the sulfuric acid ratio is high. It was confirmed that, when the sulfuric acid ratio is the ratio X, the sulfuric acid concentration decreases only to approximately 90%, even if 100 or more substrates W are processed while recovering the SPM supplied to the substrate W.

As described above, with the present preferred embodiment, the SPM of high sulfuric acid concentration is recovered in the sulfuric acid tank 27 and the recovered SPM is reused as the sulfuric acid. As can be understood from FIG. 7, if the concentration of the sulfuric acid in the recovered SPM is high, the sulfuric acid concentration is unlikely to decrease even when a large number of substrates W are processed. The concentration of the sulfuric acid in the sulfuric acid tank 27 can thereby be maintained at a value appropriate for reuse over a long period. Frequency of replacement of the sulfuric acid inside the sulfuric acid tank 27 and frequency of replenishing fresh sulfuric acid into the sulfuric acid tank 27 can thereby be reduced.

As described above, with the present preferred embodiment, the sulfuric acid and the hydrogen peroxide water are mixed to prepare the first SPM and the prepared first SPM is supplied to the substrate W. Then, after the supply of the first SPM is stopped, the sulfuric acid and the hydrogen peroxide water are mixed to prepare the second SPM and the prepared second SPM is supplied to the substrate W. The first SPM and the second SPM are thereby supplied to the substrate W and the resist is removed from the substrate W.

In preparing the first SPM, the sulfuric acid and the hydrogen peroxide water are mixed at the first mixing ratio. In preparing the second SPM, the sulfuric acid and the hydrogen peroxide water are mixed at the second mixing ratio. Each of the first mixing ratio and the second mixing ratio represents a ratio of the volume of the sulfuric acid before mixing with respect to the volume of the hydrogen peroxide water before mixing. The first mixing ratio is less than the second mixing ratio. The concentration of the hydrogen peroxide water contained in the first SPM is thus higher than the concentration of the hydrogen peroxide water contained in the second SPM.

Due to being relatively high in the hydrogen peroxide water concentration, the first SPM has a higher removal ability than the second SPM. The resist can thus be removed from the substrate W efficiently. Also, the second SPM is supplied to the substrate W after the first SPM is supplied to the substrate W. Although the second SPM is inferior to the first SPM in removal ability, nearly all of the resist is removed from the substrate W by the supply of the first SPM and just resist that is comparatively easy to remove remains on the substrate W. The resist can thus be removed from the substrate W reliably even with the second SPM of inferior removal ability.

The first SPM expelled from the substrate W flows not into recovery piping 56 but into the first drain piping 52. The first SPM expelled from the substrate W is relatively high in hydrogen peroxide water concentration and relatively low in sulfuric acid concentration. Not only that, the first SPM expelled from the substrate W contains a large amount of contaminants (carbide of the resist, etc.) formed by the reaction of the first SPM and the resist. The first SPM expelled from the substrate W is thus not suited for recovery.

On the other hand, the second SPM expelled from the substrate W is relatively high in sulfuric acid concentration. Further, an amount of contaminants contained in the second SPM expelled from the substrate W is less than the amount of contaminants contained in the first SPM expelled from the substrate W. The second SPM that is relatively high in sulfuric acid concentration and low in contaminant content is thus guided to the recovery piping 56 and mixed again with the hydrogen peroxide water. Thereby, the sulfuric acid contained in the second SPM reacts with the hydrogen peroxide water and fresh SPM is prepared. The disposal amount of the SPM can thus be reduced.

The SPM is thus recovered when the sulfuric acid concentration, that is, a proportion of the volume of the sulfuric acid before mixing with respect to the volume of the sulfuric acid and the hydrogen peroxide water before mixing is high, and SPM of high sulfuric acid concentration can thus be recovered. Further, the state of high sulfuric acid concentration is not maintained but the SPM that is high in hydrogen peroxide water concentration and has sufficient removal ability is supplied to the substrate W before starting the recovery of the SPM, and therefore the resist can be removed efficiently from the substrate W. The SPM that is high in sulfuric acid concentration can thus be recovered while removing the resist efficiently from the substrate W.

With the present preferred embodiment, the first SPM expelled from the substrate W is received by the first guard 43 surrounding the substrate W. The second SPM expelled from the substrate W is received by the second guard 44 surrounding the substrate W. The first SPM received by the first guard 43 flows into the first drain piping 52 connected to the first guard 43. The second SPM received by the second guard 44 flows into the recovery piping 56 connected to the second guard 44.

The first SPM expelled from the substrate W contains a large amount of contaminants. Therefore, after the first guard 43 receives the first SPM, contaminants may remain on an inner peripheral surface of the first guard 43. If the second SPM expelled from the substrate W is received and recovered by the first guard 43, the contaminants attached to the first guard 43 may become mixed in the second SPM. An amount of contaminants contained in the recovered SPM can thus be reduced by making the second SPM be received by the second guard 44 that differs from the first guard 43.

With the present preferred embodiment, the first SPM expelled from the substrate W when the supply of the first SPM is stopped is received by the first guard 43. Thereafter, the state of the first guard 43 and the second guard 44 is switched from the first facing state to the second facing state and the second SPM expelled from the substrate W is received by the second guard 44. That is, the switching from the state, in which the first guard 43 faces the substrate W directly, to the state, in which the second guard 44 faces the substrate W directly, is performed after the expelling of the first SPM of high contaminant content ends. Contamination of the second guard 44 by the first SPM of high contaminant content can thereby be prevented.

With the present preferred embodiment, the first SPM expelled from the substrate W is received by the first guard 43. Thereafter, the second SPM is supplied to the substrate W and expelled from the substrate W. The second SPM expelled from the substrate W when the supply of the second SPM is started is received by the first guard 43. Thereafter, the state of the first guard 43 and the second guard 44 is switched from the first facing state to the second facing state and the second SPM expelled from the substrate W is received by the second guard 44.

The amount of contaminants contained in the second SPM expelled from the substrate W is less than the amount of contaminants contained in the first SPM expelled from the substrate W. Therefore, the first SPM of high contaminant content is received by the first guard 43 and thereafter, the second SPM of low contaminant content is received by the first guard 43. The contaminants attached to the inner wall 43a of the first guard 43 are thereby washed off. When the contaminants attached to the first guard 43 are dried, the contaminants may drift in a space in which the substrate W is disposed and become attached to the substrate W. Contamination of the substrate W can thus be reduced.

Further, when the supply of the second SPM is started, the resist that is comparatively easy to remove remains on the substrate W and contaminants may be contained in the second SPM expelled from the substrate W. In this case, after elapse of some time from the start of supply of the second SPM, all of the resist is removed from the substrate W and the second SPM that does not contain or hardly contains contaminants is expelled from the substrate W.

Even if contaminants are contained in the second SPM expelled from the substrate W when the supply of the second SPM is started, such second SPM is guided to the first drain piping 52 via the first guard 43. The second SPM that contains contaminants can thus be prevented from being recovered in the recovery piping 56. Further, the first guard 43 is cleaned using such second SPM and therefore the first guard 43 can be cleaned without increasing a usage amount of the SPM.

With the present preferred embodiment, the substrate W and the first guard 43 are moved relatively in the up-down direction when the second SPM expelled from the substrate W is received by the first guard 43. The position at which the second SPM directly hits the inner wall 43a of the first guard 43 is thereby moved up or down with respect to the first guard 43. A range in which the second SPM directly hits the first guard 43 is thus broadened and the contaminants attached to the inner wall 43a of the first guard 43 can thus be removed effectively.

With the present preferred embodiment, the sulfuric acid and the hydrogen peroxide water are supplied to the SPM nozzle 18 and are mixed inside the SPM nozzle 18. The first SPM is thereby prepared. Thereafter, the first SPM is supplied to the substrate W. An oxidizing ability of peroxymonosulfuric acid (also called "Caro's acid"), which is formed by the reaction of the sulfuric acid and the hydrogen peroxide water, decreases with the elapse of time. Such decrease in oxidizing ability can be kept at a minimum by supplying the SPM, which is the liquid mixture of the sulfuric acid and the hydrogen peroxide water, to the substrate W immediately after mixing the sulfuric acid and the hydrogen peroxide water. The first SPM of high removal ability can thereby be supplied to the substrate W and time required for removing the resist can be shortened.

With the present preferred embodiment, the mixing ratio (ratio of the sulfuric acid with respect to the hydrogen peroxide water) is continuously increased from the first mixing ratio to the second mixing ratio when the SPM is being supplied to the substrate W. Thereby, the first SPM is supplied to the substrate W and the second SPM is supplied to the substrate W thereafter. When the hydrogen peroxide water contained in the SPM decreases and the hydrogen peroxide water concentration decreases, the SPM decreases in temperature. The temperature of the SPM can be made to change continuously by changing the mixing ratio continuously. The resist can thus be removed efficiently while preventing sudden temperature change of the substrate W.

Although the recovered second SPM contains components besides the sulfuric acid, not less than half of it is the sulfuric acid. When the recovery and reuse of the SPM are repeated, the sulfuric acid concentration of the recovered sulfuric acid decreases gradually. In other words, the sulfuric acid contained in the recovered SPM gradually increases in water concentration. The second SPM that flowed into the recovery piping 56 is recovered in the sulfuric acid tank 27 that stores the sulfuric acid. When the sulfuric acid concentration of the sulfuric acid inside the sulfuric acid tank 27 is measured and the measured sulfuric acid concentration falls below the lower limit value, the sulfuric acid of higher sulfuric acid concentration than the sulfuric acid inside the sulfuric acid tank 27 is supplied into the sulfuric acid tank 27. The sulfuric acid concentration of the sulfuric acid inside the sulfuric acid tank 27 can thereby be maintained within a range suitable for reuse.

Other Preferred Embodiments

The present invention is not restricted to the contents of the above described preferred embodiments and various modifications are possible.

For example, as shown in FIG. 8, before mixing the sulfuric acid and the hydrogen peroxide water at the first mixing ratio, the sulfuric acid and the hydrogen peroxide water may be mixed at a third mixing ratio greater than the first mixing ratio to prepare a third SPM and the prepared third SPM may be supplied to the substrate W. The third mixing ratio maybe equal to the second mixing ratio or may differ from the second mixing ratio. FIG. 8 shows an example where the third mixing ratio is less than the second mixing ratio.

If, when a pattern of low strength is formed on the substrate W, the removal of the resist is started by supplying SPM of high hydrogen peroxide water concentration to the substrate W, the pattern may sustain damage. Therefore, by increasing the hydrogen peroxide water concentration continuously as shown in FIG. 8, pattern damage can be reduced even when a pattern of low strength is formed on the substrate W. Further, by increasing the hydrogen peroxide water concentration continuously, the SPM temperature is increased gradually, and the substrate W can thereby be prevented from rising suddenly in temperature.

In the example of processing of the substrate W described above, the flow rate of the SPM discharged from the SPM nozzle 18 does not have to be fixed. For example, at the time of switching between the guards 43 and 44, that is, at the time T4 shown in FIG. 5, a supply flow rate of the SPM supplied to the substrate W may temporarily be made less than the supply flow rate of the SPM in a period from the time T1 to the time T2 shown in FIG. 5. Alternatively or additionally, the rotational speed of the substrate W at the time of switching between the guards 43 and 44 may be made slower than the rotational speed of the substrate W in the period from the time T1 to the time T2 shown in FIG. 5.

If the switching between the guards 43 and 44 is performed while sustaining the supply of the SPM to the substrate W (that is, while sustaining the expelling of the SPM from the substrate W), the SPM expelled from the substrate W may collide against an upper end of the first guard 43 (an inner peripheral end of the upper end portion 66 shown in FIG. 2) and may scatter in an unexpected direction.

By decreasing the supply flow rate of the SPM supplied to the substrate W or slowing down the rotational speed of the substrate W when switching between the guards 43 and 44, the SPM scattering from the peripheral edge portion of the substrate W can be decreased in impetus (speed) and an amount of the SPM scattering from the peripheral edge portion can be reduced. A member, other than the first guard 43, that is disposed inside the chamber 7 can thereby be suppressed or prevented from being contaminated by the SPM expelled from the substrate W.

The supply of the SPM to the substrate W may be stopped temporarily when switching between the guards 43 and 44. In this case, an amount of the SPM expelled from the substrate W decreases and therefore the SPM expelled from the substrate W can be prevented from colliding against the upper end of the first guard 43 (the inner peripheral end of the upper end portion 66 shown in FIG. 2) and scattering in an unexpected direction.

Figure 9:
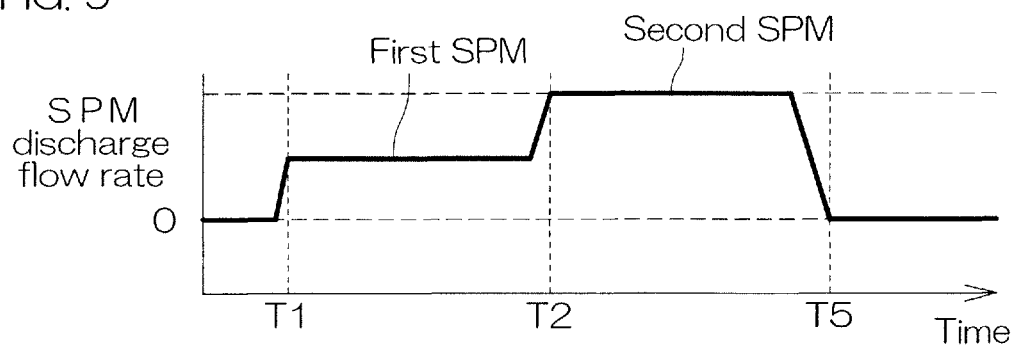
FIG. 9 is a timing chart according to a third preferred embodiment of the present invention.

In the example of processing of the substrate W described above, the flow rate of the second SPM discharged toward the substrate W may be greater than the flow rate of the first SPM discharged toward the substrate W as shown in FIG. 9. In this case, the flow rate of the second SPM is preferably greater than the flow rate of the first SPM by a percentage in a range, for example, of not less than 5% to not more than 20% and especially not less than 5% to not more than 12%.

The second SPM is high in sulfuric acid concentration in comparison to the first SPM. Therefore, in comparison to the first SPM, the second SPM is lower in heat of reaction generated by the mixing of the hydrogen peroxide water and the sulfuric acid and is lower in temperature. When the temperature of the second SPM decreases, a peeling ability that is sufficient for the resist may not be obtained. When the flow rate of the second SPM discharged toward the substrate W is increased, the temperature of the second SPM on the substrate W increases. The peeling ability of the second SPM can thereby be increased further.

Also, additionally or alternatively to increasing the flow rate of the second SPM discharged toward the substrate W, the rotational speed of the substrate W in the second SPM supplying step may be made slower than the rotational speed of the substrate W in the first SPM supplying step to slow down a speed at which the SPM is expelled from the substrate W. The same effect as that described above can be obtained in this case as well. If the rotational speed of the substrate W changes with the elapse of time in at least one of the first and second SPM supplying steps, a minimum value of the rotational speed of the substrate W in the second SPM supplying step may be less than a minimum value of the rotational speed of the substrate W in the first SPM supplying step.

Figure 10:
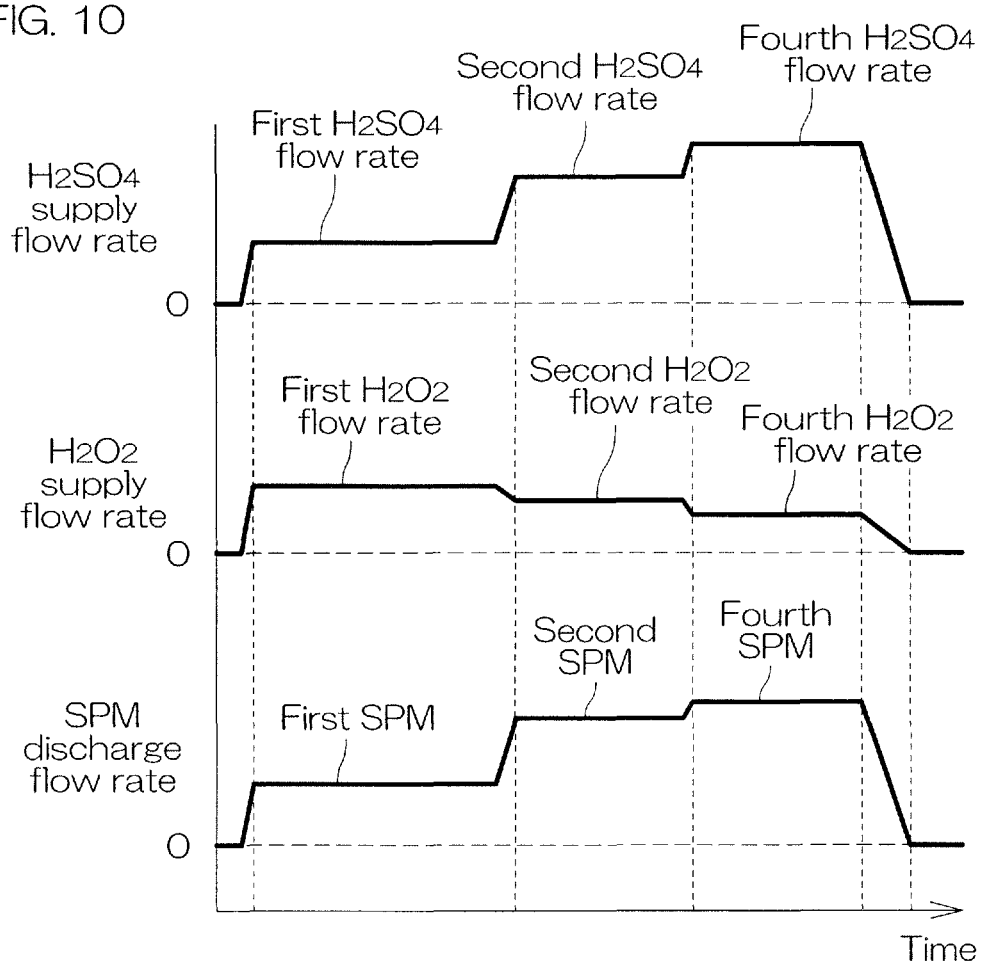
FIG. 10 is a timing chart according to a fourth preferred embodiment of the present invention.

In the example of processing of the substrate W described above, after the second SPM supplying step, the sulfuric acid and the hydrogen peroxide water may be mixed at a fourth mixing ratio (fourth $H_2SO_4$ flow rate/fourth $H_2O_2$ flow rate), greater than the second mixing ratio (second $H_2SO_4$ flow rate/second $H_2O_2$ flow rate) to prepare a fourth SPM and the prepared fourth SPM may be supplied to the substrate W as shown in FIG. 10. In this case, the flow rate of the fourth SPM discharged toward the substrate W may be equal to or may differ from the flow rate of the second SPM discharged toward the substrate W. To prevent decrease of the peeling ability of the SPM, the flow rate of the fourth SPM may be made greater than the flow rate of the second SPM by a percentage in a range, for example, of not less than 5% to not more than 20% and especially not less than 5% to not more than 12%.

Switching of the processing cup 11 between the first facing state and the third facing state or switching between the second facing state and the third facing state may be performed instead of switching between the first facing state and the second facing state.

The recovery piping 56 may be connected directly to a bottom portion of the second cup 42 without interposition of the common piping 55. In this case, the SPM inside the second cup 42 is recovered in the sulfuric acid supply portion 26 via the recovery piping 56. The second drain piping 57 and the switching unit (the recovery valve 58 and the drain valve 59) are therefore omitted.

The SPM expelled from the substrate W may be received using a single guard from the beginning to the end of the SPM step S3. For example, the SPM may be received by the second guard 44. In this case, when the SPM received by the second guard 44 is recovered, the recovery valve 58 (see FIG. 2) is opened and the drain valve 59 is closed.

In the SPM step S3, the first guard 43 may be lowered from the upper position to the lower position without keeping it still at the cleaning height position.

In the example of processing of the substrate W described above, a first cleaning step of cleaning the upper surface of the substrate W using a first cleaning liquid and a second rinsing step of rinsing off the first cleaning liquid with the rinse liquid may be executed before the SPM step S3. For example, hydrofluoric acid (HF) can be cited as an example of the first cleaning liquid. The first cleaning step and the second rinsing step may be executed in the state where the processing cup 11 is in the first facing state.

In the example of processing of the substrate W described above, a hydrogen peroxide water supplying step of supplying the hydrogen peroxide water to the upper surface (front surface) of the substrate W may be executed after the SPM step S3 and before the rinsing step S4. In this case, the controller 3 closes just the sulfuric acid valve 24 while keeping the hydrogen peroxide water valve 36 opened. Just the hydrogen peroxide water is thereby supplied to the SPM nozzle 18 and the hydrogen peroxide water is discharged from the discharge port of the SPM nozzle 18. The hydrogen peroxide water supplying step may be executed in the state where the processing cup 11 is in the first facing state.

In the example of processing of the substrate W described above, a second cleaning step of cleaning the upper surface of the substrate W using a second cleaning liquid and a third rinsing step of rinsing off the second cleaning liquid with the rinse liquid may be executed after the rinsing step S4. For example, SC1 (a liquid mixture containing $NH_4OH$ and $H_2O_2$) can be cited as an example of the second cleaning liquid. The second cleaning step and the third rinsing step may be executed in the state where the processing cup 11 is in the first facing state.

An organic solvent replacement step of supplying IPA (isopropyl alcohol) or other organic solvent that is lower in surface tension than water and higher in volatility than water to the substrate W and replacing the rinse liquid on the substrate W with the organic solvent may be executed before the drying step S5. The organic solvent replacement step may be executed in the state where the processing cup 11 is in the third facing state.

Figure 11:
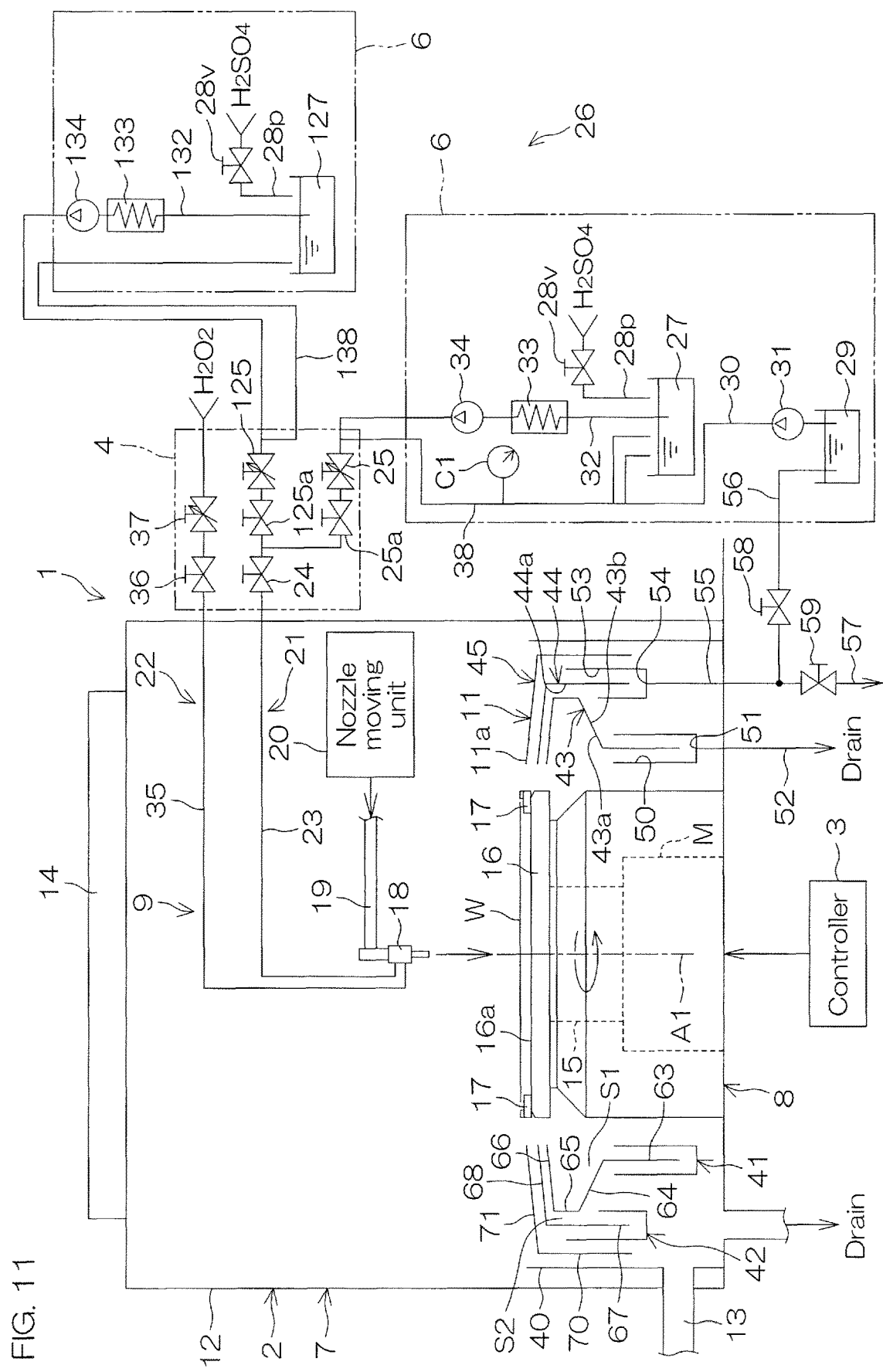
FIG. 11 is a schematic view showing a sulfuric acid supply portion of an SPM supplying unit according to a fifth preferred embodiment of the present invention.

As shown in FIG. 11, the sulfuric acid supplying portion 26 of the SPM supplying unit 9 may further include a high concentration sulfuric acid tank 127 storing the sulfuric acid to be supplied to the sulfuric acid piping 23. The sulfuric acid concentration of the sulfuric acid (to be more accurate, an aqueous solution of sulfuric acid) inside the high concentration sulfuric acid tank 127 is higher than the sulfuric acid concentration of the sulfuric acid inside the sulfuric acid tank 27.

The sulfuric acid inside the high concentration sulfuric acid tank 127 maybe unused sulfuric acid (for example, concentrated sulfuric acid) or may be a liquid mixture of unused sulfuric acid and the recovered SPM. Also, the high concentration sulfuric acid tank 127 may be housed in the same storage box 6 as the sulfuric acid tank 27 or may be housed in a separate storage box 6 from the sulfuric acid tank 27. FIG. 11 shows an example where the high concentration sulfuric acid tank 127 is housed in a separate storage box 6 from the sulfuric acid tank 27 and the recovered SPM is not supplied to the high concentration sulfuric acid tank 127.

The high concentration sulfuric acid tank 127 is connected to the sulfuric acid piping 23 by a high concentration sulfuric acid supply piping 132. The sulfuric acid inside the high concentration sulfuric acid tank 127 is fed to the sulfuric acid piping 23 by a third liquid feeding device 134. The sulfuric acid supplied to the sulfuric acid piping 23 via the high concentration sulfuric acid supply piping 132 is heated by a temperature controller 133. The sulfuric acid heated by the temperature controller 133 returns to the high concentration sulfuric acid tank 127 via a return piping 138. An upstream end of the return piping 138 is connected to the high concentration sulfuric acid supply piping 132 at an upstream side of a supply valve 125a that opens and closes the high concentration sulfuric acid supply piping 132. A downstream end of the return piping 138 is connected to the high concentration sulfuric acid tank 127.

When a supply valve 25a, interposed in the sulfuric acid supply piping 32, is opened, the sulfuric acid inside the sulfuric acid tank 27 is supplied to the sulfuric acid piping 23 at the flow rate corresponding to the opening degree of the sulfuric acid flow control valve 25. When the supply valve 125a, interposed in the high concentration sulfuric acid supply piping 132, is opened, the sulfuric acid inside the high concentration sulfuric acid tank 127 is supplied to the sulfuric acid piping 23 at a flow rate corresponding to an opening degree of a sulfuric acid flow control valve 125. The controller 3 may prepare the first SPM using the sulfuric acid inside the high concentration sulfuric acid tank 127 and prepare the second SPM using the sulfuric acid inside the sulfuric acid tank 27. That is, the first SPM may be prepared by mixing of fresh sulfuric acid with the hydrogen peroxide water, and the second SPM may be prepared by mixing of the sulfuric acid, containing the recovered SPM, with the hydrogen peroxide water.

As the recovery of the SPM in the sulfuric acid tank 27 is continued, the sulfuric acid concentration of the sulfuric acid inside the sulfuric acid tank 27 decreases gradually, and in some cases, the peeling ability of the SPM, prepared using the sulfuric acid inside the sulfuric acid tank 27, falls. By preparing the SPM using sulfuric acid of high concentration, that is, the sulfuric acid inside the high concentration sulfuric acid tank 127, the SPM of high peeling ability can be made to contact a front surface of the resist. Therefore, even if a hardened layer is formed on the surface of the resist, the hardened layer of the resist can be destroyed. After the hardened layer is destroyed, the SPM permeates into an interior of the resist (unhardened resist) through cracks in the hardened layer and the resist can thus be peeled even if the SPM, prepared using the sulfuric acid that contains the recovered SPM, is supplied to the substrate W. The resist on the substrate W can thereby be peeled reliably in a short time while suppressing a usage amount of high concentration sulfuric acid.

In the example of processing of the substrate W described above, the sulfuric acid may be supplied in place of the second SPM to the substrate W. That is, as long as the sulfuric acid concentration is higher than that of the first SPM, the liquid supplied to the substrate W after the supply of the first SPM may be either of the SPM and the sulfuric acid.

If the sulfuric acid is supplied to the substrate W in place of the second SPM, for example, the hydrogen peroxide water valve 36 (see FIG. 2) may be closed while keeping the sulfuric acid valve 24 (see FIG. 2) opened. Just the sulfuric acid is thereby discharged from the SPM nozzle 18, which is an example of a sulfuric-acid-containing liquid nozzle. The SPM supplying unit 9 is an example of a sulfuric-acid-containing liquid supplying unit.

The substrate processing apparatus 1 is not restricted to an apparatus that processes a disc-shaped substrate W, and may be an apparatus that processes a polygonal substrate W.

Two or more arrangements among all the arrangements described above may be combined. Two or more steps among all the steps described above may be combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method of removing a resist from a substrate by SPM which is a liquid mixture of sulfuric acid and hydrogen peroxide water, the substrate processing method comprising:
   a first SPM supplying step of supplying the substrate with a first SPM prepared by mixing the sulfuric acid and the hydrogen peroxide water at a first mixing ratio that represents a ratio of the sulfuric acid with respect to the hydrogen peroxide water;
   a sulfuric-acid-containing liquid supplying step of supplying the substrate with a sulfuric-acid-containing liquid containing the sulfuric acid at a higher concentration than that of the first SPM, after the supply of the first SPM in the first SPM supplying step is stopped;
   a draining step of making the first SPM, supplied to the substrate and expelled from the substrate in the first SPM supplying step, flow into a drain piping;
   a recovery step of making the sulfuric-acid-containing liquid, supplied to the substrate and expelled from the substrate in the sulfuric-acid-containing liquid supplying step, flow into a recovery piping; and
   a remixing step of preparing the SPM by mixing the hydrogen peroxide water with the sulfuric-acid-containing liquid guided by the recovery piping.

2. The substrate processing method according to claim 1, wherein the sulfuric-acid-containing liquid supplying step includes a second SPM supplying step of supplying the substrate with a second SPM prepared by mixing the sulfuric acid and the hydrogen peroxide water at a second mixing ratio that represents a ratio of the sulfuric acid with respect to the hydrogen peroxide water and is greater than the first mixing ratio, after the supply of the first SPM in the first SPM supplying step is stopped,
   the recovery step includes a step of making the second SPM, supplied to the substrate and expelled from the substrate in the second SPM supplying step, flow into the recovery piping, and
   the remixing step includes a step of preparing the SPM by mixing the hydrogen peroxide water with sulfuric acid that contains the second SPM guided by the recovery piping.

3. The substrate processing method according to claim 2, further comprising:
   a first SPM capturing step of making a first guard, surrounding the substrate and connected to the drain piping, receive the first SPM expelled from the substrate in the first SPM supplying step; and
   a second SPM capturing step of making a second guard, surrounding the substrate and connected to the recovery piping, receive the second SPM expelled from the substrate in the second SPM supplying step.

4. The substrate processing method according to claim 3, further comprising: a guard switching step of switching a state of the first guard and the second guard from a first state, in which liquid expelled from the substrate is received by the first guard, to a second state, in which liquid expelled from the substrate is received by the second guard, at the same time as stopping of or after the stopping of the supply of the first SPM in the first SPM supplying step.

5. The substrate processing method according to claim 4, wherein the guard switching step includes a step of switching the state of the first guard and the second guard from the first state to the second state after the supply of the second SPM is started in the second SPM supplying step.

6. The substrate processing method according to claim 5, wherein the guard switching step includes a relative moving step of moving the substrate and the first guard relatively in an up-down direction while making the first guard receive the second SPM expelled from the substrate.

7. The substrate processing method according to claim 1, wherein the first SPM supplying step includes an in-nozzle mixing step of mixing the sulfuric acid and the hydrogen peroxide water inside a nozzle and discharging the first SPM, prepared inside the nozzle, from the nozzle toward the substrate.

8. The substrate processing method according to claim 2, further comprising: a mixing ratio continuously increasing step of continuously increasing the ratio of the sulfuric acid with respect to the hydrogen peroxide water from the first mixing ratio to the second mixing ratio while supplying the SPM to the substrate in the first SPM supplying step and the second SPM supplying step.

9. The substrate processing method according to claim 2, wherein the recovery step includes a step of making the second SPM, supplied to the substrate and expelled from the substrate in the second SPM supplying step, flow into the recovery piping, and a step of making the second SPM that flowed into the recovery piping flow into a sulfuric acid tank storing the sulfuric acid, and
   the substrate processing method further comprises: a sulfuric acid concentration measuring step of measuring the sulfuric acid concentration of the sulfuric acid inside the sulfuric acid tank; and a sulfuric acid replenishing step of supplying sulfuric acid, having a sulfuric acid concentration higher than that of the sulfuric acid inside the sulfuric acid tank, into the sulfuric acid tank when the sulfuric acid concentration measured in the sulfuric acid concentration measuring step falls below a lower limit value.

10. The substrate processing method according to claim 2, wherein a time over which the first SPM is supplied to the substrate in the first SPM supplying step is longer than a time over which the second SPM is supplied to the substrate in the second SPM supplying step.

11. The substrate processing method according to claim 2, wherein a time over which the first SPM is supplied to the substrate in the first SPM supplying step is shorter than a time over which the second SPM is supplied to the substrate in the second SPM supplying step.

12. The substrate processing method according to claim 1, further comprising: a third SPM supplying step of supplying the substrate with a third SPM prepared by mixing the sulfuric acid and the hydrogen peroxide water at a third mixing ratio that represents a ratio of the sulfuric acid with respect to the hydrogen peroxide water and is greater than the first mixing ratio, before the supply of the first SPM to the substrate is started in the first SPM supplying step.

13. The substrate processing method according to claim 2, wherein a flow rate of the second SPM discharged toward the substrate in the second SPM supplying step is greater than a flow rate of the first SPM discharged toward the substrate in the first SPM supplying step.

14. The substrate processing method according to claim 2, further comprising: a fourth SPM supplying step of supplying the substrate with a fourth SPM prepared by mixing the sulfuric acid and the hydrogen peroxide water at a fourth mixing ratio that represents a ratio of the sulfuric acid with respect to the hydrogen peroxide water and is greater than the second mixing ratio, after the second SPM supplying step; and
    wherein the recovery step includes a step of making the second SPM, supplied to the substrate and expelled from the substrate in the second SPM supplying step, flow into the recovery piping and a step of making the fourth SPM, supplied to the substrate and expelled from the substrate in the fourth SPM supplying step, flow into the recovery piping, and
    the remixing step includes a step of preparing the SPM by mixing the hydrogen peroxide water with sulfuric acid that contains the second SPM and the fourth SPM guided by the recovery piping.

15. The substrate processing method according to claim 2, wherein the first SPM supplying step includes a step of preparing the first SPM by mixing sulfuric acid, having a sulfuric acid concentration higher than that of the sulfuric acid used in preparing the second SPM, with the hydrogen peroxide water at the first mixing ratio and
    the second SPM supplying step includes a step of preparing the second SPM by mixing the sulfuric acid, which contains the second SPM that flowed into the recovery piping, with the hydrogen peroxide water at the second mixing ratio.

16. A substrate processing apparatus that removes a resist from a substrate by SPM which is a liquid mixture of sulfuric acid and hydrogen peroxide water, the substrate processing apparatus comprising:
    a substrate holding unit that holds the substrate at least a portion of which is covered by the resist;
    a sulfuric-acid-containing liquid supplying unit, including
        a mixing ratio changing unit that changes a ratio of the sulfuric acid with respect to the hydrogen peroxide water, preparing the SPM by mixing the sulfuric acid and the hydrogen peroxide water, and supplying a sulfuric-acid-containing liquid containing the sulfuring acid to the substrate held by the substrate holding unit;
    a drain piping, into which flows a liquid that is supplied to the substrate held by the substrate holding unit and expelled from the substrate;
    a recovery piping, into which flows a liquid that is supplied to the substrate held by the substrate holding unit and expelled from the substrate;
    a switching unit, switching a piping, into which flows a liquid that is expelled from the substrate held by the substrate holding unit, between the drain piping and the recovery piping; and
    a controller, controlling the sulfuric-acid-containing liquid supplying unit and the switching unit; and
    wherein the controller executes
        a first SPM supplying step of controlling the sulfuric-acid-containing liquid supplying unit to prepare a first SPM by mixing the sulfuric acid and the hydrogen peroxide water at a first mixing ratio that represents a ratio of the sulfuric acid with respect to the hydrogen peroxide water, and supply the prepared first SPM to the substrate held by the substrate holding unit,
        a sulfuric-acid-containing liquid supplying step of controlling the sulfuric-acid-containing liquid supplying unit to prepare the sulfuric-acid-containing liquid of higher sulfuric acid concentration than that of the first SPM and supply the prepared sulfuric-acid-containing liquid to the substrate held by the substrate holding unit after the supply of the first SPM in the first SPM supplying step is stopped,
        a draining step of controlling the switching unit to make the first SPM, supplied to the substrate and expelled from the substrate in the first SPM supplying step, flow into the drain piping,
        a recovery step of controlling the switching unit to make the sulfuric-acid-containing liquid, supplied to the substrate and expelled from the substrate in the sulfuric-acid-containing liquid supplying step, flow into the recovery piping, and
        a remixing step of controlling the sulfuric-acid-containing liquid supplying unit to prepare the SPM by mixing the hydrogen peroxide water with sulfuric acid that contains the sulfuric-acid-containing liquid guided by the recovery piping.

17. The substrate processing apparatus according to claim 16, wherein the sulfuric-acid-containing liquid supplying unit includes an SPM supplying unit that mixes the sulfuric acid and the hydrogen peroxide water to prepare the SPM, that supplies the prepared SPM to the substrate held by the substrate holding unit, and that is provided with the mixing ratio changing unit, and
    the sulfuric-acid-containing liquid supplying step includes a second SPM supplying step of preparing a second SPM by mixing the sulfuric acid and the hydrogen peroxide water at a second mixing ratio that represents a ratio of the sulfuric acid with respect to the hydrogen peroxide water and is greater than the first mixing ratio, and supplying the prepared second SPM to the substrate held by the substrate holding unit, after the supply of the first SPM in the first SPM supplying step is stopped,
    the recovery step includes a step of making the second SPM, supplied to the substrate and expelled from the substrate in the second SPM supplying step, flow into the recovery piping, and
    the remixing step includes a step of preparing the SPM by mixing the hydrogen peroxide water with sulfuric acid that contains the second SPM guided by the recovery piping.

18. The substrate processing apparatus according to claim 17, further comprising:
    a first guard, connected to the drain piping and surrounding the substrate held by the substrate holding unit; and
    a second guard, connected to the recovery piping and surrounding the substrate held by the substrate holding unit; and
    wherein the switching unit includes a guard switching unit, switching a state of the first guard and the second guard between a first state, in which liquid expelled from the substrate is received by the first guard, and a second state, in which liquid expelled from the substrate is received by the second guard, and
    the controller further executes a first SPM capturing step of controlling the guard switching unit to make the first guard receive the first SPM expelled from the substrate in the first SPM supplying step and a second SPM capturing step of controlling the guard switching unit to make the second guard receive the second SPM expelled from the substrate in the second SPM supplying step.

19. The substrate processing apparatus according to claim 18, wherein the controller further executes a guard switching step of controlling the guard switching unit to switch the state of the first guard and the second guard from the first state to the second state at the same time as stopping of or after the stopping of the supply of the first SPM in the first SPM supplying step.

20. The substrate processing apparatus according to claim 19, wherein the guard switching step includes a step of switching the state of the first guard and the second guard from the first state to the second state after the supply of the second SPM is started in the second SPM supplying step.

21. The substrate processing apparatus according to claim 20, wherein the guard switching unit includes a guard elevating/lowering unit that elevates and lowers the first guard and the second guard individually and the guard switching step includes a relative moving step of making the guard elevating/lowering unit move the substrate and the first guard move relatively in an up-down direction while making the first guard receive the second SPM expelled from the substrate.

22. The substrate processing apparatus according to claim 16, wherein the sulfuric-acid-containing liquid supplying unit includes a nozzle, discharging the SPM toward the substrate held by the substrate holding unit, and the first SPM supplying step includes an in-nozzle mixing step of mixing the sulfuric acid and the hydrogen peroxide water inside the nozzle and discharging the first SPM, prepared inside the nozzle, from the nozzle toward the substrate.

23. The substrate processing apparatus according to claim 17, wherein the controller further executes a mixing ratio continuously increasing step of controlling the mixing ratio changing unit to continuously increase the ratio of the sulfuric acid with respect to the hydrogen peroxide water from the first mixing ratio to the second mixing ratio while supplying the SPM to the substrate in the first SPM supplying step and the second SPM supplying step.

24. The substrate processing apparatus according to claim 17, further comprising:

a sulfuric acid tank, which stores the sulfuric acid and into which flows the second SPM that flowed into the recovery piping; a sulfuric acid concentration meter, measuring a sulfuric acid concentration of the sulfuric acid inside the sulfuric acid tank; and a sulfuric acid replenishing unit, supplying sulfuric acid having a sulfuric acid concentration higher than that of the sulfuric acid inside the sulfuric acid tank, into the sulfuric acid tank;

the recovery step includes a step of making the second SPM, supplied to the substrate and expelled from the substrate in the second SPM supplying step, flow into the recovery piping, and a step of making the second SPM that flowed into the recovery piping flow into the sulfuric acid tank, and the controller further executes a sulfuric acid concentration measuring step of making the sulfuric acid concentration meter measure the sulfuric acid concentration of the sulfuric acid inside the sulfuric acid tank and a sulfuric acid replenishing step of making the sulfuric acid replenishing unit replenish the sulfuric acid, having a sulfuric acid concentration higher than that of the sulfuric acid inside the sulfuric acid tank, into the sulfuric acid tank when the sulfuric acid concentration measured in the sulfuric acid concentration measuring step falls below a lower limit value.

25. The substrate processing apparatus according to claim 17, wherein a time over which the first SPM is supplied to the substrate in the first SPM supplying step is longer than a time over which the second SPM is supplied to the substrate in the second SPM supplying step.

26. The substrate processing apparatus according to claim 17, wherein a time over which the first SPM is supplied to the substrate in the first SPM supplying step is shorter than a time over which the second SPM is supplied to the substrate in the second SPM supplying step.

27. The substrate processing apparatus according to claim 16, wherein the controller further executes a third SPM supplying step of controlling the SPM supplying unit to prepare a third SPM by mixing the sulfuric acid and the hydrogen peroxide water at a third mixing ratio that represents a ratio of the sulfuric acid with respect to the hydrogen peroxide water and is greater than the first mixing ratio, and supply the prepared third SPM to the substrate held by the substrate holding unit, before the supply of the first SPM to the substrate is started in the first SPM supplying step.

28. The substrate processing apparatus according to claim 17, wherein a flow rate of the second SPM discharged toward the substrate in the second SPM supplying step is greater than a flow rate of the first SPM discharged toward the substrate in the first SPM supplying step.

29. The substrate processing apparatus according to claim 17, wherein the controller further executes a fourth SPM supplying step of controlling the SPM supplying unit to prepare a fourth SPM by mixing the sulfuric acid and the hydrogen peroxide water at a fourth mixing ratio that represents a ratio of the sulfuric acid with respect to the hydrogen peroxide water and is greater than the second mixing ratio, and supply the prepared fourth SPM to the substrate held by the substrate holding unit, after the second SPM supplying step, the recovery step includes a step of making the second SPM, supplied to the substrate and expelled from the substrate in the second SPM supplying step, flow into the recovery piping and a step of making the fourth SPM, supplied to the substrate and expelled from the substrate in the fourth SPM supplying step, flow into the recovery piping, and the remixing step includes a step of preparing the SPM by mixing the hydrogen peroxide water with sulfuric acid that contains the second SPM and the fourth SPM guided by the recovery piping.

30. The substrate processing apparatus according to claim 17, further comprising: a sulfuric acid tank, which stores the sulfuric acid and into which flows the second SPM that flowed into the recovery piping; and a high concentration sulfuric acid tank, which stores sulfuric acid of higher sulfuric acid concentration than that of the sulfuric acid inside the sulfuric acid tank; and wherein the first SPM supplying step includes a step of preparing the first SPM by mixing the sulfuric acid inside the high concentration sulfuric acid tank with the hydrogen peroxide water at the first mixing ratio and the second SPM supplying step includes a step of preparing the second SPM by mixing the sulfuric acid inside the sulfuric acid tank with the hydrogen peroxide water at the second mixing ratio.

\* \* \* \* \*